(12) United States Patent
Harata et al.

(10) Patent No.: US 8,987,063 B2
(45) Date of Patent: Mar. 24, 2015

(54) MANUFACTURING METHOD OF SEMICONDUCTOR DEVICE

(75) Inventors: Ryoji Harata, Tsuruta (JP); Hiroaki Narita, Tsuruta (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 617 days.

(21) Appl. No.: 13/372,406

(22) Filed: Feb. 13, 2012

(65) Prior Publication Data
US 2012/0208324 A1 Aug. 16, 2012

(30) Foreign Application Priority Data
Feb. 14, 2011 (JP) .................................. 2011-028504

(51) Int. Cl.
| H01L 21/56 | (2006.01) |
| H01L 21/60 | (2006.01) |
| H01L 23/495 | (2006.01) |
| H01L 23/00 | (2006.01) |
| B29C 45/14 | (2006.01) |

(Continued)

(52) U.S. Cl.
CPC .... *H01L 23/49503* (2013.01); *H01L 23/49575* (2013.01); *H01L 21/565* (2013.01); *H01L 21/568* (2013.01); *H01L 24/48* (2013.01); *H01L 24/97* (2013.01); *H01L 2224/32257* (2013.01); *B29C 45/14655* (2013.01); *B29C 45/0046* (2013.01); *H01L 23/3107* (2013.01); *H01L 2224/32245* (2013.01); *H01L 2224/48095* (2013.01); *H01L 2224/48137* (2013.01); *H01L 2224/48247* (2013.01); *H01L 2224/48465* (2013.01); *H01L 2224/48471* (2013.01); *H01L 2224/4848* (2013.01); *H01L 2224/73265* (2013.01); *H01L 2924/18165* (2013.01); *H01L 2924/01029* (2013.01); *H01L 2224/97* (2013.01); *H01L 24/32* (2013.01); *H01L 24/45* (2013.01); *H01L 24/73* (2013.01); *H01L 24/85* (2013.01); *H01L 2224/45144* (2013.01); *H01L 2224/85439* (2013.01); *H01L 2924/10253* (2013.01); *H01L 2924/10329* (2013.01); *H01L 2924/1421* (2013.01); *H01L 2924/13091* (2013.01); *H01L 2224/83191* (2013.01); *H01L 2924/13064* (2013.01); *H01L 2924/30107* (2013.01)
USPC ............ 438/123; 438/124; 257/666; 257/787

(58) Field of Classification Search
CPC .............. H01L 24/97; H01L 23/49503; H01L 23/49575; H01L 21/565
USPC ........... 438/123, 124; 257/666, 787, E21.504
See application file for complete search history.

(56) References Cited

U.S. PATENT DOCUMENTS 5,715,147 A * 2/1998 Nagano ......................... 361/813
6,611,051 B2 * 8/2003 Akiyama et al. .............. 257/685

(Continued)

FOREIGN PATENT DOCUMENTS

JP 2001-135767 A 5/2001

*Primary Examiner* — Mary Wilczewski
*Assistant Examiner* — Toniae Thomas
(74) *Attorney, Agent, or Firm* — Miles & Stockbridge P.C.

(57) ABSTRACT

A manufacturing method of a semiconductor device of a thin resin sealed multichip rectangular package having wire connection between the chips, wherein: at least one chip is fixed to a die pad thinned more than a die pad support lead, the die pad is supported by die pad support leads arranged to respectively connect a pair of long sides of the rectangle, and sealing resin is introduced from one side of the pair of long sides when resin molding is performed.

20 Claims, 27 Drawing Sheets

(51) Int. Cl.
  *B29C 45/00* (2006.01)
  *H01L 23/31* (2006.01)

(56) References Cited

U.S. PATENT DOCUMENTS

| | | | | |
|---|---|---|---|---|
| 6,642,610 B2 * | 11/2003 | Park et al. | ...................... | 257/678 |
| 7,208,826 B2 * | 4/2007 | Sakamoto et al. | ............. | 257/687 |
| 7,521,778 B2 * | 4/2009 | Kimura | .......................... | 257/666 |
| 7,575,957 B2 * | 8/2009 | Huang et al. | .................. | 438/123 |
| 8,828,801 B2 * | 9/2014 | McMillan et al. | ............. | 438/111 |
| 8,828,805 B2 * | 9/2014 | Numazaki | ..................... | 438/123 |
| 2002/0125555 A1 * | 9/2002 | Akiyama et al. | ............... | 257/685 |
| 2003/0201523 A1 * | 10/2003 | Akiyama et al. | ............... | 257/685 |
| 2005/0112932 A1 * | 5/2005 | Akiyama et al. | ............... | 439/395 |
| 2006/0267193 A1 * | 11/2006 | Akiyama et al. | ............... | 257/725 |
| 2007/0108570 A1 * | 5/2007 | Kimura | ......................... | 257/676 |
| 2008/0191325 A1 * | 8/2008 | Shirasaka | ..................... | 257/666 |
| 2012/0164794 A1 * | 6/2012 | Xue et al. | ...................... | 438/123 |
| 2012/0238056 A1 * | 9/2012 | Numazaki | ..................... | 438/107 |

* cited by examiner

MANUFACTURING METHOD OF SEMICONDUCTOR DEVICE

CROSS-REFERENCE TO RELATED APPLICATION

The disclosure of Japanese Patent Application No. 2011-28504 filed on Feb. 14, 2011 including the specification, drawings and abstract is incorporated herein by reference in its entirety.

BACKGROUND

The present invention relates to an effective technology to apply to an assembly technology in a manufacturing method of a semiconductor device (or a semiconductor integrated circuit device).

Japanese Patent Laid-Open No. 2001-135767 (Patent Document 1) discloses a technology of bending upwardly a pair of sides facing each other of a die pad to improve adhesion of the die pad and sealing resin when the die pad is exposed to a back surface of a package in semiconductor packages such as a QFN (Quad Flat Non-leaded Package) and a TSOP (Thin Small Outline Package).

SUMMARY

Along with reduction in size and thickness of electronic devices, there has also been increasing request for reduction in size and thickness of semiconductor devices mounted over the electronic devices. To realize reduction in size and thickness of the semiconductor device, it is effective to mount a plurality of semiconductor chips over a single semiconductor device so that they are flatly arranged (arranged side by side). In a multichip type semiconductor device, such as a multichip module, using a lead frame, at least a part of the chips needs to be mounted over a die pad (a chip mounting portion) that is a part of the lead frame from a viewpoint of characteristics or strength. However, in a multichip thin package for which a package thickness of a submillimeter region is required, it is difficult to sufficiently reduce thickness if the chips are mounted over a usual die pad.

The invention in, the present application has been made to solve these problems.

A purpose of the present invention is to provide a manufacturing process of a semiconductor device that can reduce its thickness.

The other purposes and the new feature of the present invention will become clear from the description of the present specification and the accompanying drawings.

The following explains briefly the outline of a typical invention among the inventions disclosed in the present application.

In a manufacturing method of a thin resin sealed multichip package type semiconductor device being rectangular and having wire bonding connection between chips, one invention of the present application is that at least one chip is die-bonded over a die pad thinner than a die pad support lead, the die pad is supported by a plurality of die pad support leads arranged to connect a pair of long sides of the rectangle, and that sealing resin is introduced from one of the paired long sides when resin molding is performed.

The following explains briefly the effect acquired by the typical invention among the inventions disclosed in the present application.

In the manufacturing method of the thin resin sealed multichip package type semiconductor device being rectangular and having the wire bonding connection between the chips, since at least one chip is die-bonded over the die pad thinner than the die pad support lead, the die pad is supported by the die pad support leads arranged to respectively connect the pair of long sides of the rectangle, and the sealing resin is introduced from one of the paired long sides when resin molding is performed, voids can be reduced.

DETAILED DESCRIPTION

Outline of Embodiments

Figure 1:
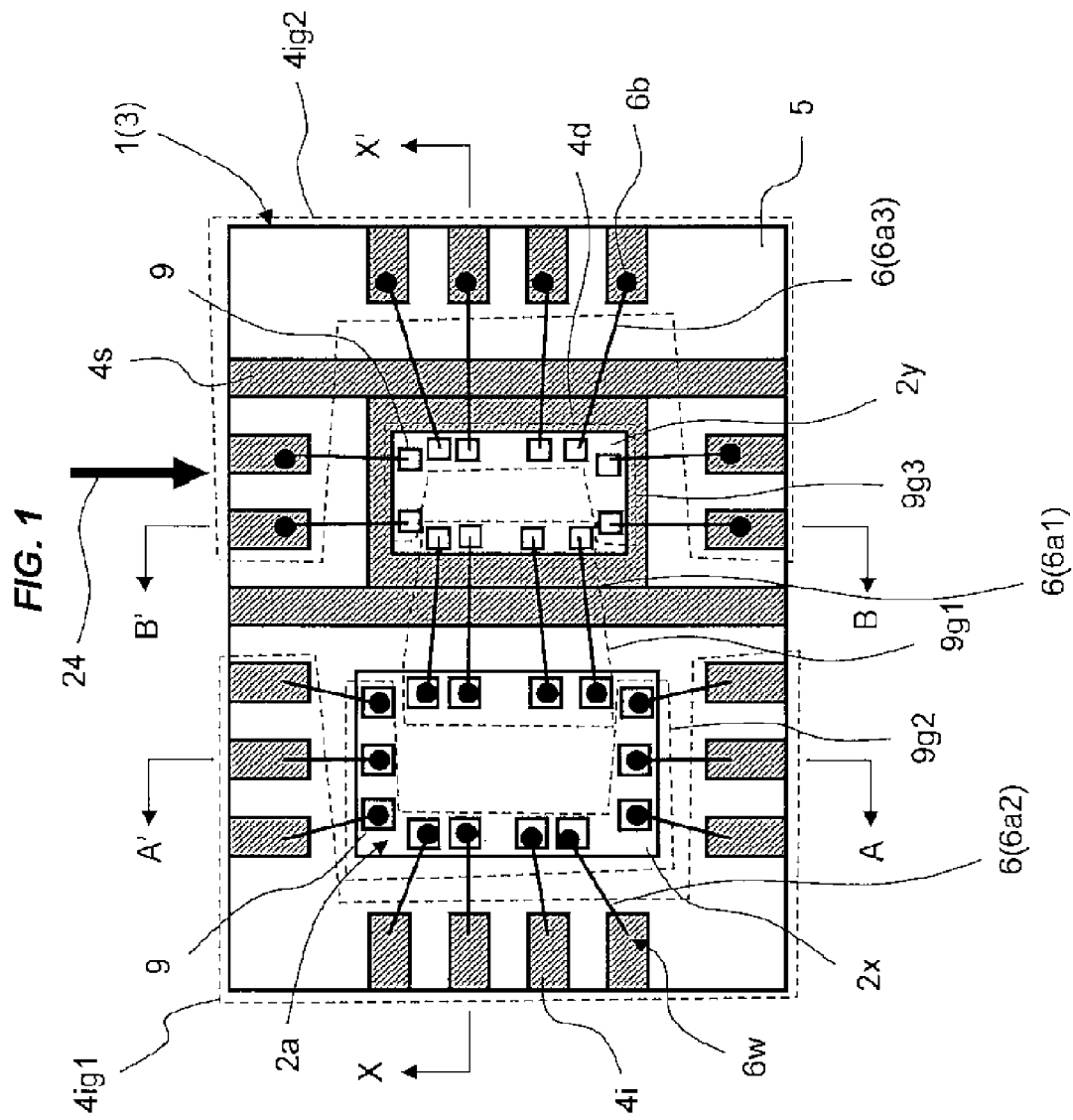
FIG. 1 is a top view of a device (package) showing a target device structure in a manufacturing method of a semiconductor device in accordance with an embodiment of the present application (in which sealing resin on a top surface side is removed so that an inside of the device can be easily viewed).

First, a summary of a typical embodiment of the invention disclosed in the present application will be explained.

1. A manufacturing method of a semiconductor device including the steps of (a) providing a lead frame having a plurality of unit device regions that includes a plurality of connection leads, a die pad, and a plurality of die pad support leads which are thicker than the die pad and that support the die pad, a shape in a plan view of each of the unit device being a rectangle; (b) arranging a first semiconductor chip having a plurality of bonding pads in each of the unit device regions; (c) arranging a second semiconductor chip having a plurality of bonding pads over a front surface of the die pad of each of the unit device regions such that the second semiconductor chip is aligned with the first semiconductor chip along a long side of each of the unit device regions; (d) electrically connecting a first bonding pad group of the bonding pads of the first semiconductor chip and that of the second semiconductor chip via a first bonding wire group in each of the unit device regions; (e) electrically connecting a second bonding pad group of the bonding pads of the first semiconductor chip and a first connection lead group of the connection leads via a second bonding wire group; (f) electrically connecting a second bonding pad group of the bonding pads of the second semiconductor chip and a second connection lead group of the connection leads via a third bonding wire group; and (g) after the steps (d), (e), and (f), forming a resin sealing body by sealing the unit device regions with sealing resin. The die pad support leads connect between one and the other of a pair of long sides facing to each other in each of the unit device regions. The sealing resin in the step (g) is supplied from the one side toward the other side of the pair of long sides.

2. In the manufacturing method of the semiconductor device of the clause 1, a back surface of the die pad is exposed from the resin sealing body.

3. In the manufacturing method of the semiconductor device of the clause 1 or 2, back surfaces of the connection leads are exposed from the resin sealing body.

4. In the manufacturing method of the semiconductor device of any one of clauses 1 to 3, the connection leads are approximately as thick as the die pad support leads.

5. In the manufacturing method of the semiconductor device of any one of clauses 1 to 4, the die pad is thinned by etching from its surface side.

6. In the manufacturing method of the semiconductor device of any one of clauses 1 to 5, the step (b) is carried out by fixing the first semiconductor chip to a lead frame back surface tape attached to the back surface of the lead frame via a first adhesive layer over a back surface of the first semiconductor chip.

7. In the manufacturing method of the semiconductor device of any one of clauses 1 to 6, a surface of the first adhesive layer on an opposite side of the first semiconductor chip is exposed from the resin sealing body.

8. In the manufacturing method of the semiconductor device of any one of clauses 1 to 7, in the step (d), the first semiconductor chip side is ball-bonded, and the second semiconductor chip side is wedge-bonded.

9. In the manufacturing method of the semiconductor device of any one of clauses 1 to 8, the second semiconductor chip is thinner than the first semiconductor chip.

10. In the manufacturing method of the semiconductor device of any one of clauses 1 to 9, the first semiconductor chip is an antenna switch, and the second semiconductor chip is a control chip that controls the first semiconductor chip.

11. In the manufacturing method of the semiconductor device of any one of clauses 1 to 10, the first semiconductor chip is a compound semiconductor chip, and the second semiconductor chip is a silicon semiconductor chip.

12. In the manufacturing method of the semiconductor device of any one of clauses 1 to 10, the first semiconductor chip is a GaAs semiconductor chip, and the second semiconductor chip is the silicon semiconductor chip.

13. In the manufacturing method of the semiconductor device of any one of clauses 1 to 12, the plurality of rectangular unit device regions are arranged in matrix.

14. In the manufacturing method of the semiconductor device of any one of clauses 1 to 13, positions of the die pad support leads in each unit device region approximately match those of a plurality of die pad support leads in an adjacent unit device region that is adjacent with one long side in the unit device region.

15. In the manufacturing method of the semiconductor device of any one of clauses 1 to 14, the resin sealing body seals the two or more unit device regions.

16. The manufacturing method of the semiconductor device of any one of clauses 1 to 15, further including the steps of: (h) after the step (g), peeling the lead frame back surface tape; and (i) after the step (h), separating the resin sealing body into portions corresponding to the individual unit device region.

17. In the manufacturing method of the semiconductor device of the clause 16, the step (i) is carried out by dicing with a rotating blade.

18. In the manufacturing method of the semiconductor device of the clause 16 or 17, when the lead frame back surface tape is removed in the step (h), the first adhesive layer remains on the first semiconductor chip side.

19. In the manufacturing method of the semiconductor device of any one of clauses 1 to 18, a thickness of the resin sealing body is 0.5 millimeter or less.

20. In the manufacturing method of the semiconductor device of any one of clauses 16 to 19, the individually separated resin sealing body is a QFN package.

21. In the manufacturing method of the semiconductor device of any one of clauses 16 to 19, the individually separated resin sealing body is an SON package.

22. In the manufacturing method of the semiconductor device of anyone of clauses 1 to 21, the step (g) is carried out by transfer molding.

Next, a summary of the other embodiment of the invention disclosed in the present application will be explained.

1. A manufacturing method of a semiconductor device including the following steps of (a) providing a lead frame having a plurality of unit device regions including (x1) a plurality of connection leads, (x2) a die pad, and (x3) a plurality of die pad support leads which are thicker than the die pad and that support the die pad, a shape in a plan view of each of the unit device being a rectangle; (b) die-bonding a first semiconductor chip in each unit device region; (c) die-bonding a second semiconductor chip on a front surface of the die pad in the each unit device region such that the second semiconductor chip is aligned with the first semiconductor chip along a long side each of the unit device regions; (d) interconnecting between the first semiconductor chip and the second semiconductor chip by connecting to each other with a bonding wire first bonding pad groups arranged along sides facing each other of a plurality of bonding pads over the first semiconductor chip and the second semiconductor chip in the each unit device region; (e) connecting between a second bonding pad group of the bonding pads over the first semiconductor chip and a first connection lead group of the connection leads through a bonding wire; (f) connecting between a third bonding pad group of the bonding pads over the second semiconductor chip and a second connection lead group of the connection leads through the bonding wire; and (g) after the steps (d), (e), and (f), forming a resin sealing body by transfer molding the each unit device region with sealing resin. The die pad support leads have connected between the pair of long sides of the rectangle. The sealing resin in the step (g) is introduced from one of the paired long sides.

2. In the manufacturing method of the semiconductor device of the clause 1, a back surface of the die pad is exposed from the resin sealing body.

3. In the manufacturing method of the semiconductor device of the clause 1 or 2, back surfaces of the connection leads are exposed from the resin sealing body.

4. In the manufacturing method of the semiconductor device of any one of clauses 1 to 3, the connection leads are approximately as thick as the die pad support leads.

5. In the manufacturing method of the semiconductor device of any one of clauses 1 to 4, the die pad is thinned by etching from its surface side.

6. In the manufacturing method of the semiconductor device of any one of clauses 1 to 5, the step (b) is carried out by fixing the first semiconductor chip to a lead frame back surface tape attached to the back surface of the lead frame via a first adhesive layer over a back surface of the first semiconductor chip.

7. In the manufacturing method of the semiconductor device of any one of clauses 1 to 6, a surface of the first adhesive layer on an opposite side of the first semiconductor chip is exposed from the resin sealing body.

8. In the manufacturing method of the semiconductor device of any one of clauses 1 to 7, in the step (d), the first semiconductor chip side is ball-bonded, and the second semiconductor chip side is wedge-bonded.

9. In the manufacturing method of the semiconductor device of any one of clauses 1 to 8, the second semiconductor chip is thinner than the first semiconductor chip.

10. In the manufacturing method of the semiconductor device of any one of clauses 1 to 9, the first semiconductor chip is an antenna switch, and the second semiconductor chip is a control chip that controls the first semiconductor chip.

11. In the manufacturing method of the semiconductor device of any one of clauses 1 to 10, the first semiconductor chip is a compound semiconductor chip, and the second semiconductor chip is a silicon semiconductor chip.

12. In the manufacturing method of the semiconductor device of any one of clauses 1 to 10, the first semiconductor chip is a GaAs semiconductor chip, and the second semiconductor chip is the silicon semiconductor chip.

13. In the manufacturing method of the semiconductor device of any one of clauses 1 to 12, the plurality of rectangular unit device regions are arranged in matrix.

14. In the manufacturing method of the semiconductor device of any one of clauses 1 to 13, positions of the die pad support leads in each unit device region approximately match those of a plurality of die pad support leads in an adjacent unit device region that is adjacent with one long side between the regions.

15. In the manufacturing method of the semiconductor device of any one of clauses 1 to 14, the resin sealing body collectively seals the two or more unit device regions.

16. The manufacturing method of the semiconductor device of any one of clauses 1 to 15, further including the steps of: (h) after the step (g), peeling the lead frame back surface tape; and (i) after the step (h), separating the resin sealing body into portions corresponding to the individual unit device region.

17. In the manufacturing method of the semiconductor device of the clause 16, the step (i) is carried out by dicing with a rotating blade.

18. In the manufacturing method of the semiconductor device of the clause 16 or 17, when the lead frame back surface tape is removed in the step (h), the first adhesive layer remains on the first semiconductor chip side.

19. In the manufacturing method of the semiconductor device of any one of clauses 1 to 18, a thickness of the resin sealing body is 0.5 millimeter or less.

20. In the manufacturing method of the semiconductor device of any one of clauses 16 to 19, the individually separated resin sealing body is an SON package.

[Explanation of Description Form, Basic Term, and Usage in the Present Application]

1. In the present application, embodiments may be described, divided into plural sections for convenience, if necessary. Except for the case where it shows clearly in particular not right, they are not mutually independent and separate, and are modifications of each portion of an example, one being detail of a part of the other or the part or all. In addition, the repetition of similar portions is omitted in principle. In addition, each component in the embodiments is not indispensable, except for the case where it is specified to be not right in particular, except for the case where it is theoretically limited to the number, and except for the case where it is clearly not right from the context.

Furthermore, in the present application, when referring to a "semiconductor device" or a "semiconductor integrated circuit device", it mainly means a device having a semiconductor chip mounted over a base material (a lead frame). The semiconductor chip means a chip in which a piece of various transistors (active elements), and a resistance, a capacitor, and other components are integrated over the semiconductor chip, such as a single crystal silicon substrate, centering on the transistor (including a module in which the semiconductor chips are integrated in a package). In addition, typical various transistors mainly in a silicon semiconductor chip includes an MISFET (Metal Insulator Semiconductor Field Effect Transistor) typified by an MOSFET (Metal Oxide Semiconductor Field Effect Transistor). A typical integrated circuit configuration includes a CMIS (Complementary Metal Insulator Semiconductor) type integrated circuit typified by a CMOS (Complementary Metal Oxide Semiconductor) type integrated circuit that is a combination of an N-channel type MISFET and a P-channel type MISFET.

Furthermore, typical and various transistors mainly in a compound semiconductor chip include an MESFET (Metal-Semiconductor Field Effect Transistor) and a HEMT (High Electron Mobility Transistor).

2. Similarly, in the description of the embodiments, even though "X including A" is used for explaining materials and compositions, they are not intended to eliminate materials, compositions in which a component other than A is one of main components except for the case where it is specified to be not right in particular, and except for the case where it is clearly not right from the context. As for a constituent, "X including A" means that "X including A as the main constituent". A "silicon member" are not intended to limit to pure silicon, but they also include members containing multicomponent alloy whose main constituents are SiGe alloy or other silicon, containing other additives. A "silicon oxide film" and a "silicon oxide insulating film" are not intended to limit only to comparatively pure Undoped Silicon Dioxide, but they include a thermal oxide film, such as FSG (Fluorosilicate Glass), TEOS-based Silicon Oxide, SiOC (Silicon Oxicarbide) or Carbon-doped Silicon Oxide or OSG (Organosilicate Glass), PSG (Phosphorus Silicate Glass), and BPSG (Borophosphosilicate Glass); coating-type silicon oxide, such as a CVD oxide film, SOG (Spin ON Glass), and NCS (Nano-Clustering Silica); a silica Low-k insulating film (porous insulating film) in which holes are introduced into a similar member to the above; and a composite film with an other silicon insulating film mainly including the above.

In addition, the silicon insulating film regularly used in the semiconductor field along with the silicon oxide insulating film includes a silicon nitride insulating film. SiN, SiCN, SiNH, and SiCNH are included as a material belonging to this type of insulating film. "silicon nitride" includes both SiN and SiNH except for the case where it is specified to be not right in particular. "SiCN" includes both SiCN and SiCNH except for the case where it is specified to be not right in particular.

3. Similarly, although preferred examples are described on figures, positions, and attributes, the invention is not strictly limited to these except for the case where it is specified to be not right in particular, and except for the case where it is clearly not right from the context.

4. Further, also when a specific numeric value or quantity is mentioned, it may be a numeric value exceeding the specific numeric value, and may be a numeric value less than the specific numeric value except for the case where it is specified to be not right in particular, except for the case where it is theoretically limited to the number, and except for the case where it is clearly not right from the context.

5. Although a "wafer" usually means a single crystal silicon wafer over which a semiconductor device (a semiconductor integrated circuit device and an electronic device are also the same) is formed, an insulating substrate such as an epitaxial wafer, an SOI substrate, and an LCD glass substrate; a composite wafer such as a semiconductor layer, and the like are included.

In addition, a "semiconductor chip", an "integrated circuit chip", a "chip", and the like mean a single body (an integrated circuit formed over a semiconductor substrate or an insulating substrate). Semiconductor chips currently used widely are classified into "silicon semiconductor chips" and "compound semiconductor chips". Typical semiconductors corresponding to the "compound semiconductor chips" include GaAs, GaN, AlGaAs, SiC, InSb, and InP (including these composite substrates). In contrast, typical semiconductors corresponding to the silicon semiconductor chips include the semiconductors formed over the single crystal silicon substrate, and the epitaxial silicon substrate. Since a SiGe device (although it is strictly the compound semiconductor) is often integrated over the silicon substrate in the present application, semiconductors including the ones integrated over a single SiGe device and the silicon semiconductor substrate are classified into the "silicon" semiconductors for convenience.

6. A package form mainly dealt with in the embodiments of the present application is usually referred to as a QFN package (Quad Flat Non-leaded Package).

In addition, the lead frame back surface tape (adhesive sheet) used in accordance with the embodiments of the present application is a resin thin film used to attach on the back surface of the lead frame and keep a strength in manufacturing steps (additionally, preventing the sealing resin from entering, and supporting a back surface of the chip). A thickness of the resin thin film is about tens of micrometers. Polyimide thermosetting resin and the like are usually used for a base material of the resin thin film.

Furthermore, the compound semiconductor chip in accordance with the embodiments of the present application may be a high frequency antenna switch used for a cellular phone. The silicon semiconductor chip may be a control chip (a chip having a control function for the high frequency antenna switch).

In the present application, when it is necessary to distinguish a lead or a bar having a special role, such as a die pad support lead (a tab suspension lead) from a usual lead, such as an inner lead (a lead for wire bonding), the "usual lead" is referred to as a "connection lead."

In addition, when a chip, a package, a lead frame, and these portions are referred to as a "top surface" or a "surface", a "bottom surface" or a "back surface" in the present application, a surface of a chip side of the lead frame is referred to as the "top surface" or the "surface" regardless of a direction of a space, and a surface opposite thereto is referred to as the "bottom surface" or the "back surface" except for the case of clearly showing particularly not right.

Although wire bonding is usually carried out by using bonding tools, such as a capillary, by a Thermosonic method in which heating, bonding pressurization, and ultrasonic vibration are applied approximately simultaneously, bonding in which a first bonding point is set to be a tip side and in which a second bonding point is set to be a connection lead side is referred to as a "forward direction bonding", and vice versa is referred to as an "opposite direction bonding" when bonding between the chip and the lead in the present application. In addition, when bonding between two chips, bonding in which the first bonding point is set to be a chip A side and in which the second bonding point is set to be a chip B side is referred to as a "forward direction bonding with respect to a chip A", and vice versa is referred to as an "opposite direction bonding with respect to the chip A."

In addition, in the present application, arranging (mounting) a semiconductor chip over a die pad is referred to as "indirect die bonding", and bonding outside the die pad is referred to as "direct die bonding".

Furthermore, a method for resin-sealing the plurality of unit device regions, and then dividing the sealing body into an individual package is referred to as a collectively sealing method or a MAP (Mold Array Package) method. In contrast to this, a method for individually resin-sealing the single unit device region is referred to as an "individually sealing method" in the present application.

Details of Embodiments

The embodiments will be further explained in detail. In each drawing, the same or the similar portion is indicated with the same or similar symbol or reference numeral, and explanation thereof is not repeated in principle.

In addition, when becoming rather complicated, or when distinction with a void is clear in the accompanying drawings, hatching may be omitted even if it is a cross section. In relation to this, when obvious from explanation, an outline of a background may be omitted even in a case of a planarly closed hole. Furthermore, hatching may be attached even if it is not the cross section in order to clearly show that it is not the void.

1. Explanation of a target device structure in a manufacturing method of a semiconductor device of one embodiment of the present application (mainly from FIGS. 1 to 8)

A package mainly explained in the present application is thin. A main target package is particularly the one whose thickness is 0.5 millimeter or less (a main range is 0.2 millimeter or more to 0.5 millimeter or less). The invention in the present application is not limited to the thickness. It can be applied also to a package whose thickness is other than this.

Although a package storing two semiconductor chips will be specifically explained, the number of semiconductor chips to be stored may be three or four. The number is only required to be two or more.

Figure 2:
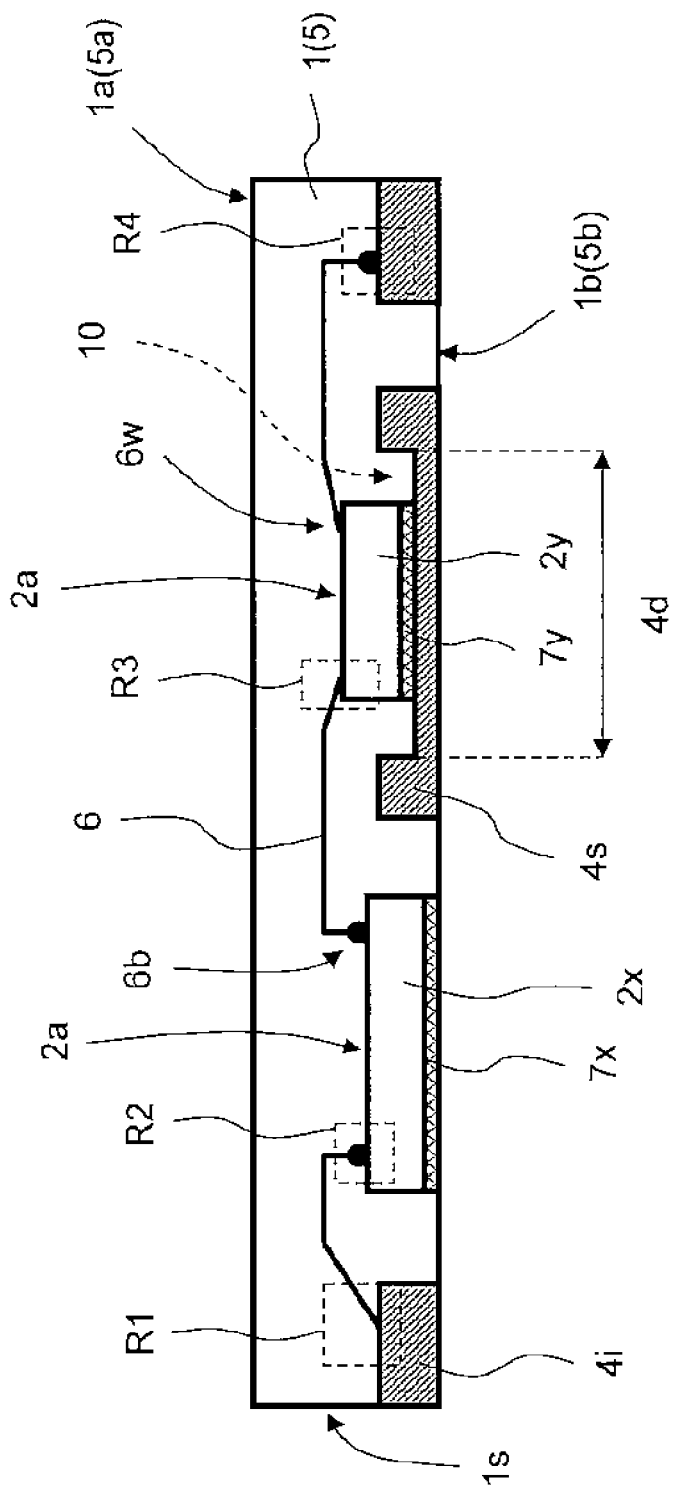
FIG. 2 is a cross-sectional view of the device (package) corresponding to a cross section taken along a line X-X' of FIG. 1 (a bonding pad and the like are omitted from FIGS. 7 to 23 to avoid complication).
Figure 3:
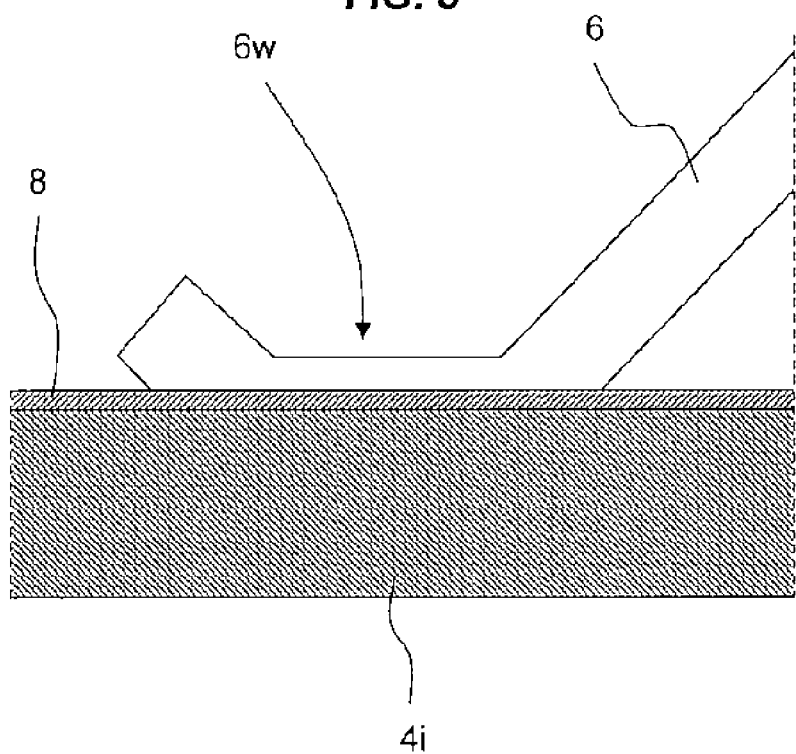
FIG. 3 is a partial cross-sectional view of a wedge bonding portion peripheral region R1 over a lead in FIG. 2.
Figure 4:
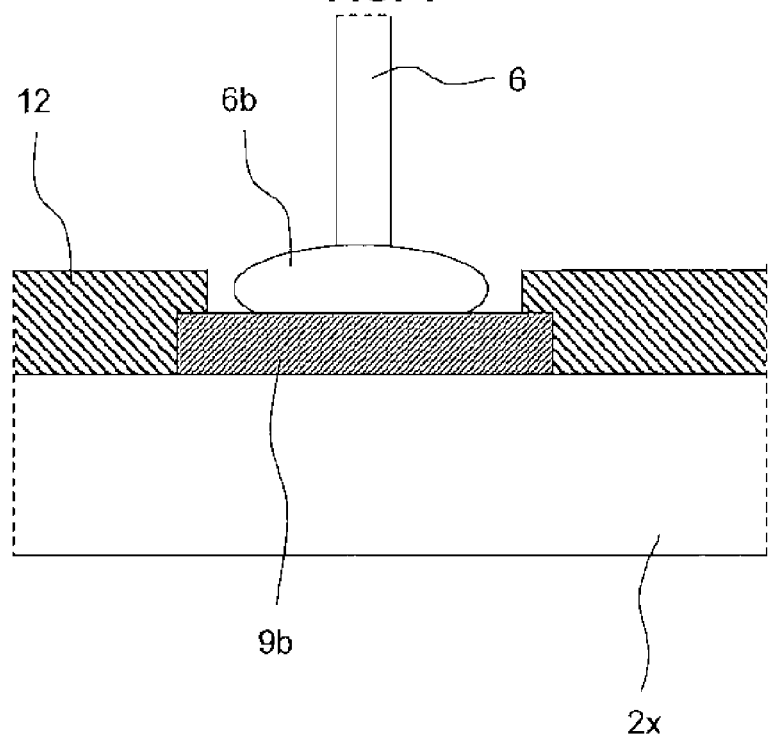
FIG. 4 is a partial cross-sectional view of a ball bonding portion peripheral region R2 over a chip in FIG. 2.
Figure 5:
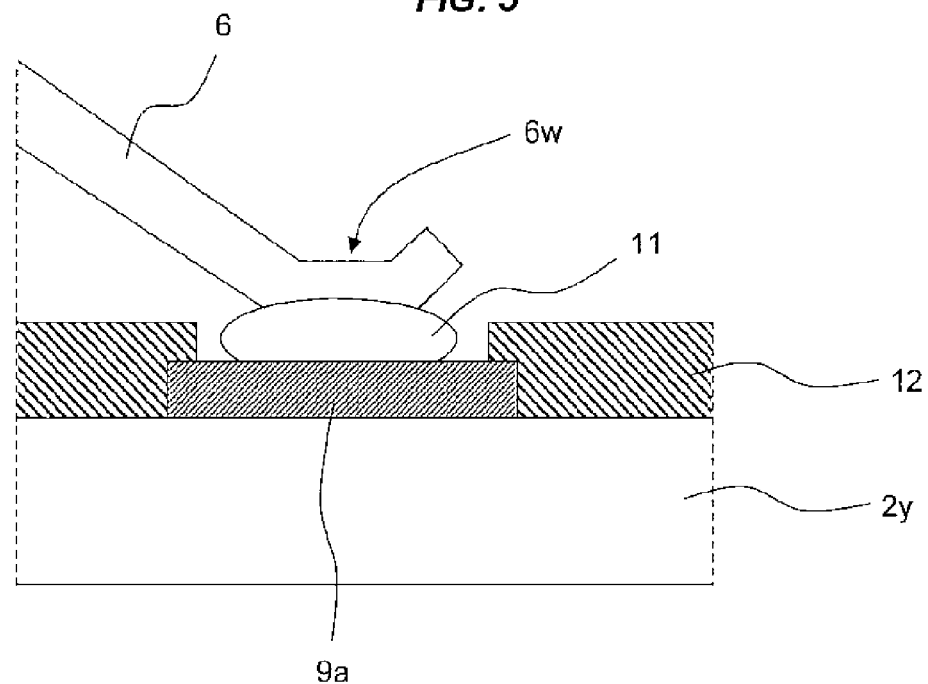
FIG. 5 is a partial cross-sectional view of a wedge bonding portion peripheral region R3 over the chip in FIG. 2.
Figure 6:
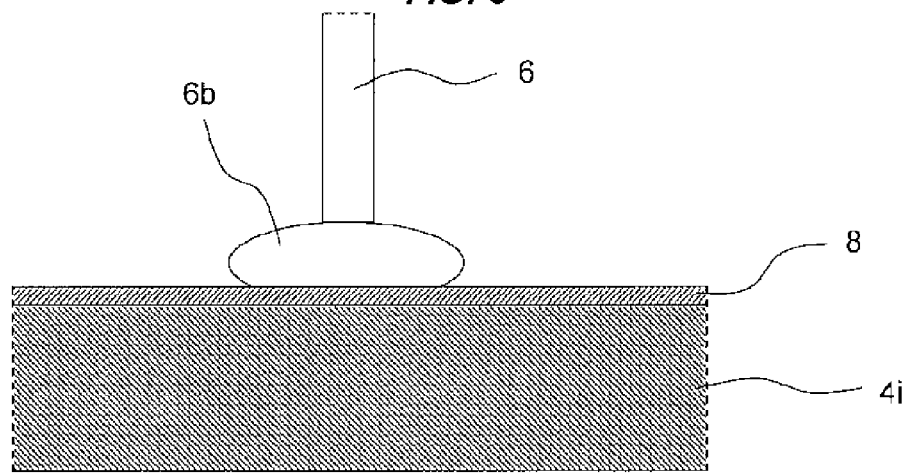
FIG. 6 is a partial cross-sectional view of a ball bonding portion peripheral region R4 over the lead in FIG. 2.
Figure 7:
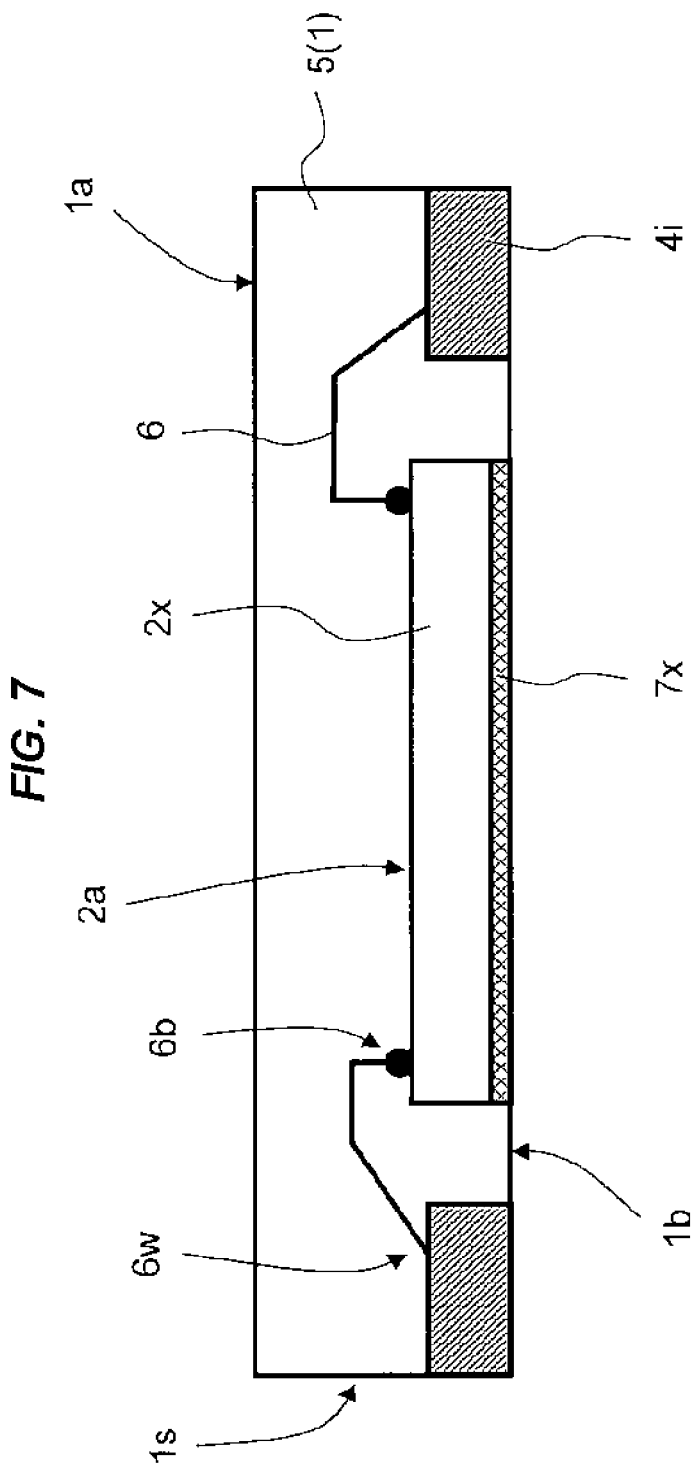
FIG. 7 is a cross-sectional view of the device (package) corresponding to a cross section taken along a line A-A' in FIG. 1.
Figure 8:
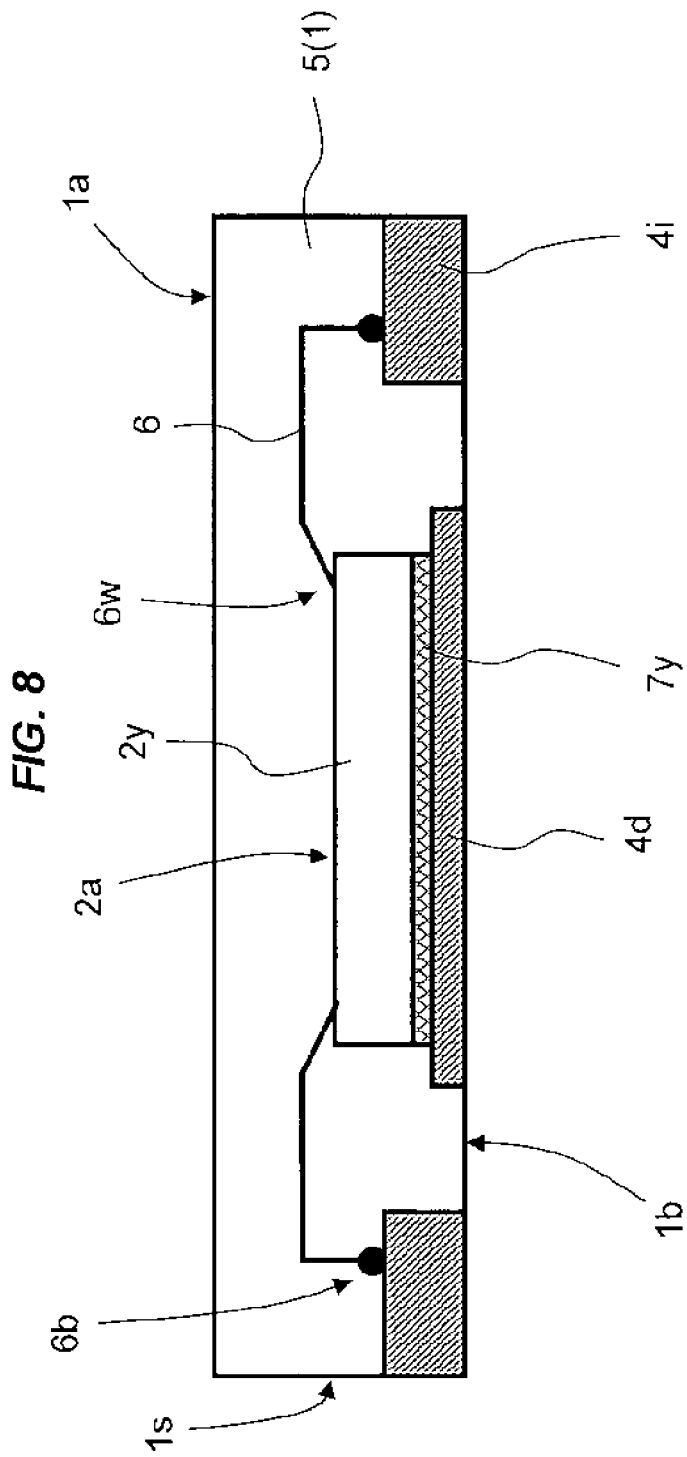
FIG. 8 is a cross-sectional view of the device (package) corresponding to a cross section taken along a line B-B' in FIG. 1.
Figure 27:
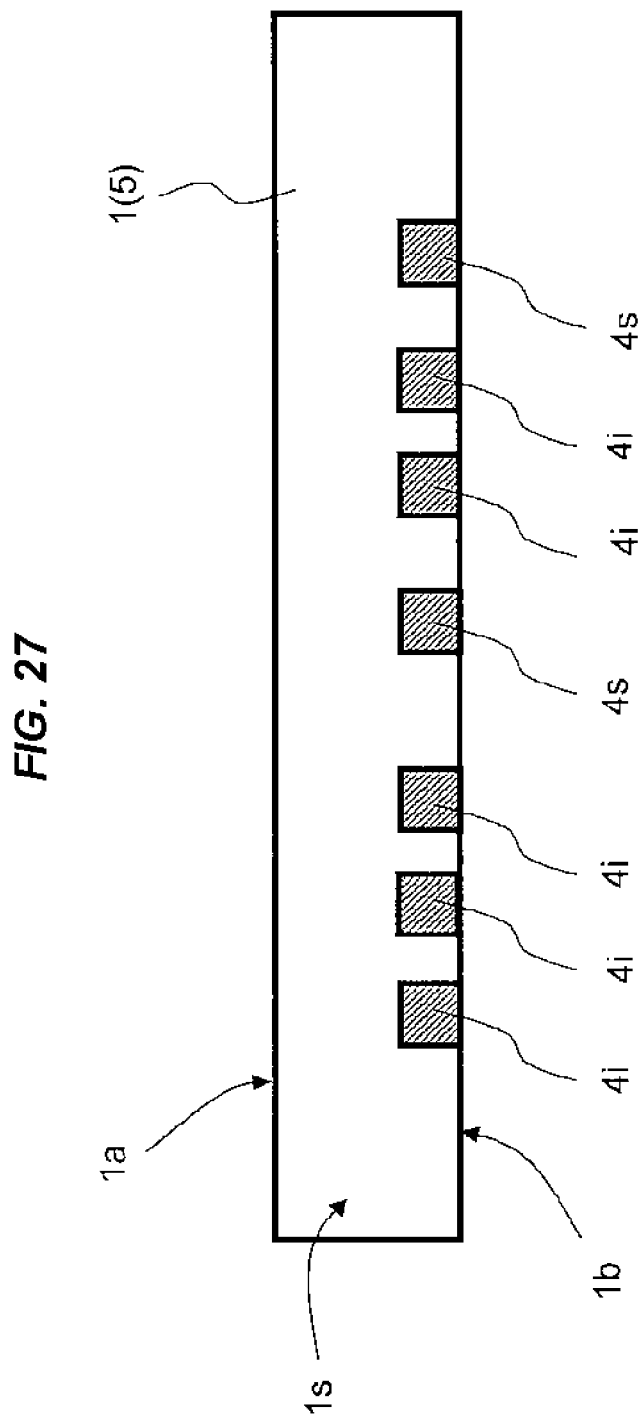
FIG. 27 is a side view of a long side of the package shown in FIGS. 1 and 2.
Figure 28:
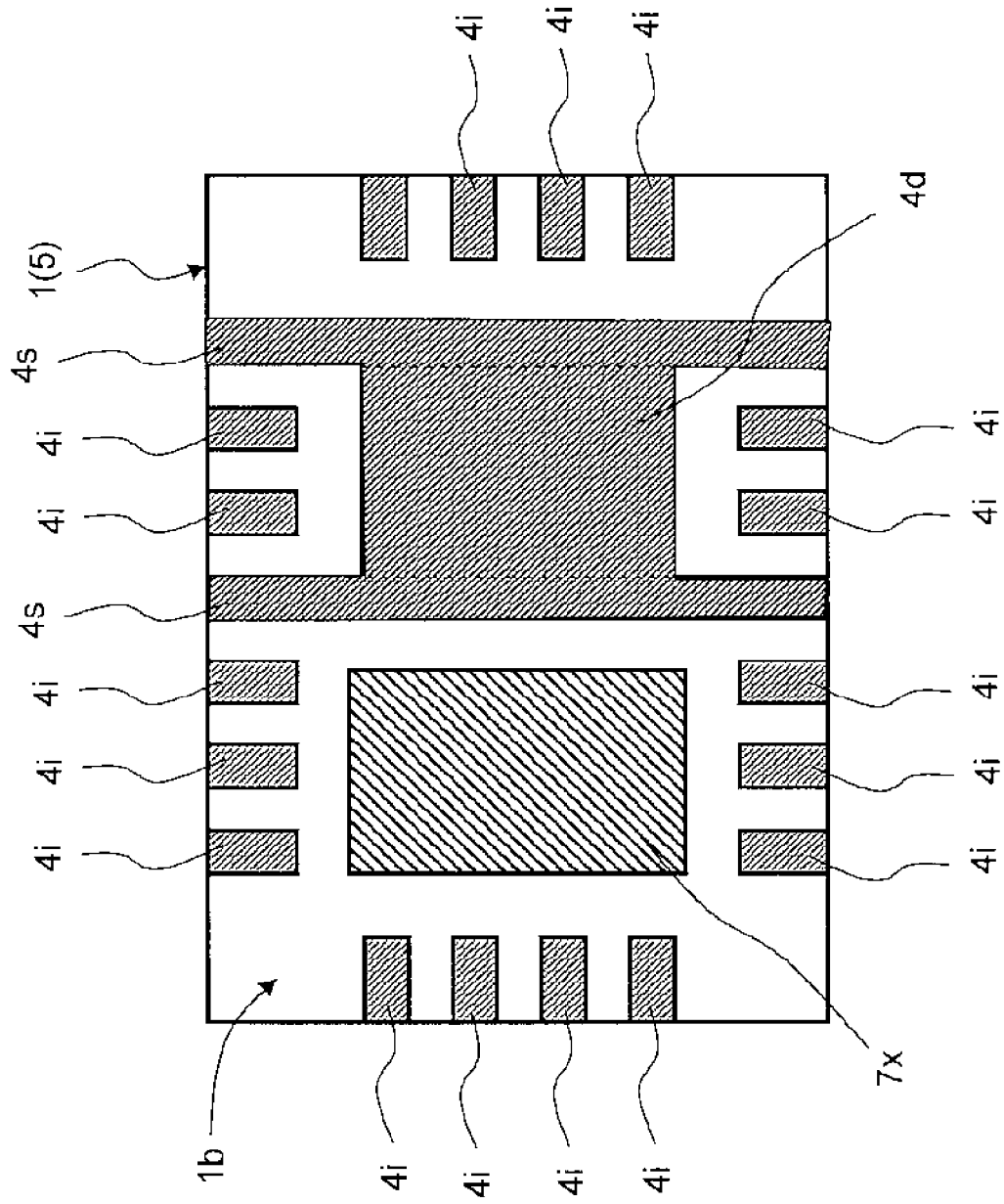
FIG. 28 is a bottom view of the package shown in FIGS. 1 and 2.

FIG. 1 is a top view of a device (package) showing a target device structure in a manufacturing method of a semiconductor device in accordance with an embodiment of the present application (in which sealing resin on a top surface side is removed so that an inside of the device can be easily viewed). FIG. 2 is a cross-sectional view of the device (package) corresponding to a cross section taken along a line X-X' of FIG. 1 (a bonding pad and the like are omitted from FIGS. 7 to 23 to avoid complication). FIG. 3 is a partial cross-sectional view of a wedge bonding portion peripheral region R1 over a lead in FIG. 2. FIG. 4 is a partial cross-sectional view of a ball bonding portion peripheral region R2 over a chip in FIG. 2. FIG. 5 is a partial cross-sectional view of a wedge bonding portion peripheral region R3 over the chip in FIG. 2. FIG. 6 is a partial cross-sectional view of a ball bonding portion peripheral region R4 over the lead in FIG. 2. FIG. 7 is a cross-sectional view of the device (package) corresponding to a cross section taken along a line A-A' in FIG. 1. FIG. 8 is a cross-sectional view of the device (package) corresponding to a cross section taken along a line B-B' in FIG. 1. FIG. 27 is a side view of a long-side side of the package shown in FIGS. 1 and 2. FIG. 28 is a bottom view of the package shown in FIGS. 1 and 2.

Based on the above-mentioned drawings, a target device structure in the manufacturing method of the semiconductor device in accordance with an embodiment of the present application (a summary of a structure of a QFN type multi-chip module) is explained. As shown in FIGS. 1 to 8, a die pad (chip mounting portion) 4d and a pair of (or a plurality of) die pad support leads 4s (tab suspension leads) that support the die pad 4d from both sides are provided in a thin resin sealed package (hereinafter referred to as a package) 1 which is rectangular. Additionally, on both sides across the die pad support lead 4s on a center side of the package 1 (this package portion corresponds to a unit device region 3 of a lead frame in manufacturing steps), placed are, a directly mounted semiconductor chip (a compound semiconductor chip or a first semiconductor chip) 2x such as a GaAs semiconductor chip (a high frequency antenna switch), and a mounted-over-die-pad semiconductor chip (a silicon semiconductor chip or a second semiconductor chip) 2y such as a silicon semiconductor chip (a control chip of the high frequency antenna switch). The die pad 4d is explained in detail. The die pad 4 of the embodiment is thinner than the die pad support lead 4s. A top surface (a surface over which the chip is mounted) of the die pad 4d is closer to a bottom surface side of a resin sealing body 5 than a top surface of the die pad support lead 4s on the same surface side of the top surface of the die pad 4d (when viewed from a cross section, the top surface of the die pad 4d is between the top surface of the die pad support lead 4s on the same surface side of the top surface of the die pad 4d and the bottom surface of the die pad support lead 4s on an opposite side of the top surface of the die pad support lead 4s). The mounted-over-die-pad semiconductor chip 2y is die-bonded (arranged, secured, or fixed) over a recess region 10 of the die pad 4d via an adhesive layer (a die bonding material) 7y such as an epoxy paste layer, and the directly mounted semiconductor chip 2x is die-bonded (arranged, fixed, or attached) over an adhesive layer (a die bonding material, a first adhesive layer) 7x such as the epoxy paste layer. The adhesive layers 7x and 7y are derived from the same DAF (Die Attach Film). In addition, as can be seen from FIG. 2, since the directly mounted semiconductor chip 2x is not mounted over the die pad 4d as the mounted-over-die-pad semiconductor chip 2y in the embodiment, a bottom surface of the adhesive layer 7x (the first adhesive layer) of a back surface of the directly mounted semiconductor chip 2x (a surface opposite to a surface over which the chip is mounted) is exposed from a bottom surface 5b (1b) of the resin sealing body 5 (or the package 1). A back surface of the die pad 4d (a surface opposite to the surface over which the chip is mounted) is exposed from the bottom surface 5b (1b) of the resin sealing body 5 (or the package 1). In addition, both end surfaces of the die pad support lead 4s are exposed from a side surface is of the resin sealing body 5 (or the package 1) as shown in FIG. 27, and a bottom surface of the die pad support lead 4s is exposed from the bottom surface 5b (1b) of the resin sealing body 5 (or the package 1) as shown in FIG. 28.

At the periphery of the directly mounted semiconductor chip 2x (hereinafter referred to as a semiconductor chip 2x) and the mounted-over-die-pad semiconductor chip 2y (hereinafter referred to as a semiconductor chip 2y), arranged are a plurality of connection leads 4i (inner leads) for wire bonding and connection to an outside, and the connection leads 4i are classified into a first connection lead group 4ig1 electrically connected to the semiconductor chip 2x via s bonding wire (a bonding wire group 6a2) 6, and a second connection lead group 4ig2 electrically connected to the semiconductor chip 2y via the bonding wire (a bonding wire group 6a3) 6. The bonding wire used in the embodiment includes a gold (Au) material. In addition, as can be seen from FIGS. 2, 27, and 28, an external tip surface of the connection lead 4i is exposed from the side surface is of the resin sealing body 5 (or the package 1), and a bottom surface of the connection lead 4i is exposed from the bottom surface 5b (1b) of the resin sealing body 5 (or the package 1).

A plurality of bonding pads 9 is on top surfaces 2a (device surfaces) of the semiconductor chip 2x and the semiconductor chip 2y. The bonding pads 9 over the semiconductor chip 2x are gold bonding pads 9b as shown in FIG. 4. The bonding pads 9 over the semiconductor chip 2y are aluminum bonding pads 9a as shown in FIG. 5. The bonding pads 9 are classified into a bonding pad group 9g1 used for interconnection between the semiconductor chip 2x and the semiconductor chip 2y, a bonding pad group 9g2 used for coupling of the semiconductor chip 2x and the first connection lead group 4ig1, and a bonding pad group 9g3 used for coupling of the semiconductor chip 2y and the second connection lead group 4ig2.

The bonding pads 9 belonging to the bonding pad group 9g1 are the bonding pads for interconnection of the semiconductor chip 2x and the semiconductor chip 2y, and they are electrically connected to each other by the bonding wire (the bonding wire group 6a1) 6. In addition, this bonding wire group 6a1 first connects a part of the bonding wire group 6a1 to the bonding pad group 9g1 of the semiconductor chip 2x with the semiconductor chip 2x being as a first bonding point (the semiconductor chip 2x has been ball-bonded), and subsequently, connects the other parts of the bonding wire group 6a1 to the bonding pad group 9g1 of the semiconductor chip 2y with a semiconductor chip 2y side being as a second bonding point. At this time, since a stud bump (a bump electrode) including a gold (Au) material is formed in the bonding pad group 9g1 of the semiconductor chip 2y, the other parts of the bonding wire group 6a1 are connected (ball-bonded and wedge-bonded) to this stud bump. The bonding pad group 9g2 and the first connection lead group 4ig1 are ball-bonded and wedge-bonded with a chip side being as a first bonding point 6b (the chip side is ball-bonded), and with a connection lead side being a second bonding point 6w (the connection lead side is wedge-bonded with the gold stud bump being an underlay). The bonding pad group 9g3 and the second connection lead group 4ig2 are ball-bonded and wedge-bonded with the connection lead side being as a first bonding point (the connection lead side is ball-bonded), and with the chip side being a second bonding point (the chip side is wedge-bonded with the gold stud bump being the underlay). As a result of this, the package (the semiconductor device) 1 can be thinned. In addition, as described above, since the bonding pad group 9g1 of the semiconductor chip 2y is set as the second bonding point 6w, the remaining bonding pad group 9g3 is also set as the second bonding point 6w, and thus a bonding condition (a load by a capillary) to the semiconductor chip 2y can be unified.

Next, details of a periphery of each bonding point is explained in order. First, the wedge bonding point 6w (the second bonding point) over the connection lead 4i is explained. As shown in FIG. 3, a bonding metal film 8 such as a silver plating layer is over a top surface of the connection lead 4i, and the gold bonding wire 6 is wedge-bonded over the bonding metal film 8 by using the capillary.

Next, the ball bonding point 6b (the first bonding point) over the semiconductor chip 2x is explained. As shown in FIG. 4, the gold bonding pad 9b is over a top surface of the semiconductor chip 2x, and the gold bonding wire 6 is ball-bonded by using the capillary. A periphery of the gold bonding pad 9b is covered with a final passivation film 12 such as a silicon oxide insulating film or a polyimide insulating film.

Next, the wedge bonding point 6w (the second bonding point) over the semiconductor chip 2y is explained. As shown in FIG. 5, the aluminum bonding pad 9a is over a top surface of the semiconductor chip 2y, and the gold bonding wire 6 is wedge-bonded via a gold stud bump 11 (an underlaying bump) using the capillary.

Next, the ball bonding point 6b (the first bonding point) over the connection lead 4i is explained. As shown in FIG. 6, the bonding metal film 8, such as the silver plating layer, is over the top surface of the connection lead 4i, and the gold bonding wire 6 is ball-bonded over the bonding metal film 8 by using the capillary.

A size of each portion will be shown hereinafter to help specific understanding of the package explained. A length of a long side of the package is about 6 millimeters. A length of its short side is about 3 millimeters. A thickness of the package (a length from a top surface 1a (5a) to the bottom surface 1b (5b) of the resin sealing body 5 (the unit package 1 or the unit device)) is about 400 micrometers. A thickness of the connection lead 4i and the die pad support lead 4s is about 125 micrometers. A thickness of the die pad 4d (the recess portion 10) is about 55 micrometers. A thickness of the semiconductor chip 2x is about 140 micrometers (including the adhesive layer) (since a thickness of the adhesive layer is about 10 micrometers, that of the chip is about 130 micrometers). A length of a long side of the semiconductor chip 2x is about 1.3 millimeters. A length of its short side is about 1.1 millimeters. A thickness of the semiconductor chip 2y is about 120 micrometers (including the adhesive layer) (since the thickness of the adhesive layer is about 10 micrometers, that of the chip is about 110 micrometers). Although a case where the thickness of the semiconductor chip 2x is larger than that of the semiconductor chip 2y has been explained as described above in the embodiment, the invention is not limited to this. The semiconductor chip 2x may be as thick as the semiconductor chip 2y. However, when considering reduction in thickness of the package (the semiconductor device) 1, the semiconductor chip 2y arranged (mounted) over the die pad 4d should be preferably thinner than that of the semiconductor chip that is not arranged (mounted) over the die pad 4d. Since the semiconductor chip arranged over the die pad 4d is the silicon semiconductor chip in the embodiment, the semiconductor chip can be easily thinned more than that of the GaAs semiconductor chip.

As described above, a package structure of a target device in the manufacturing method of the semiconductor device in accordance with an embodiment of the present application is a thin rectangular structure (a planar rectangle), a plurality of semiconductor chips is arranged along longitudinal direction of the rectangle, and the pair of (the) die pad support leads 4s that support the die pad 4d having one semiconductor chip 2y mounted over there are arranged to connect between one and the other of the pair of long sides facing each other and to approximately intersect with each long side at a right angle. One of the die pad support leads 4s extends linearly (along the short side) from one long side toward the other long side in the rectangular resin sealing body 5 (or the package 1) having the pair of long sides facing each other and a pair of short sides that intersects with these long sides and that is facing each other. In addition, the others of the die pad support leads 4s are similar to the above, and are formed aligning with this one of the die pad support leads 4s when viewed from a plane. Additionally, the quadrangular die pad 4d has a pair of sides aligning with the long sides of the resin sealing body 5 and a pair of sides (sides aligning with the short sides of the resin sealing body 5) intersecting with these sides aligning with the long sides of the resin sealing body 5, and the die pad 4d is between two die pad support leads 4s when viewed from a plane. At this time, one of the pair of sides (sides aligning with the short sides of the resin sealing body 5) of the die pad 4d is connected with one of the die pad support leads 4s, and the other of the pair of sides (sides aligning with the short sides of the resin sealing body 5) of the die pad 4d is connected with the other of the die pad support leads 4s. Accordingly, the pair of the die pad support leads 4s are approximately parallel to each other. Accordingly, since sealing resin is supplied (introduced) from one side of the pair of long sides of the package as shown with an arrow as a flow direction 24 of the sealing resin as shown in FIG. 1 (refer to FIGS. 17 and 18) in the step of transfer molding, a direction of a main flow of the sealing resin in a mold cavity also becomes approximately the same as the arrow, and as a result of it, the flow direction of the sealing resin and an extending direction of the die pad support leads 4s become approximately the same, and thus the flow of the sealing resin becomes simple, and reduction in generation of voids can be expected.

2. Explanation of a manufacturing process in the manufacturing method of the semiconductor device of the one embodiment of the present application (mainly in FIGS. 9 to 23)

Figure 9:
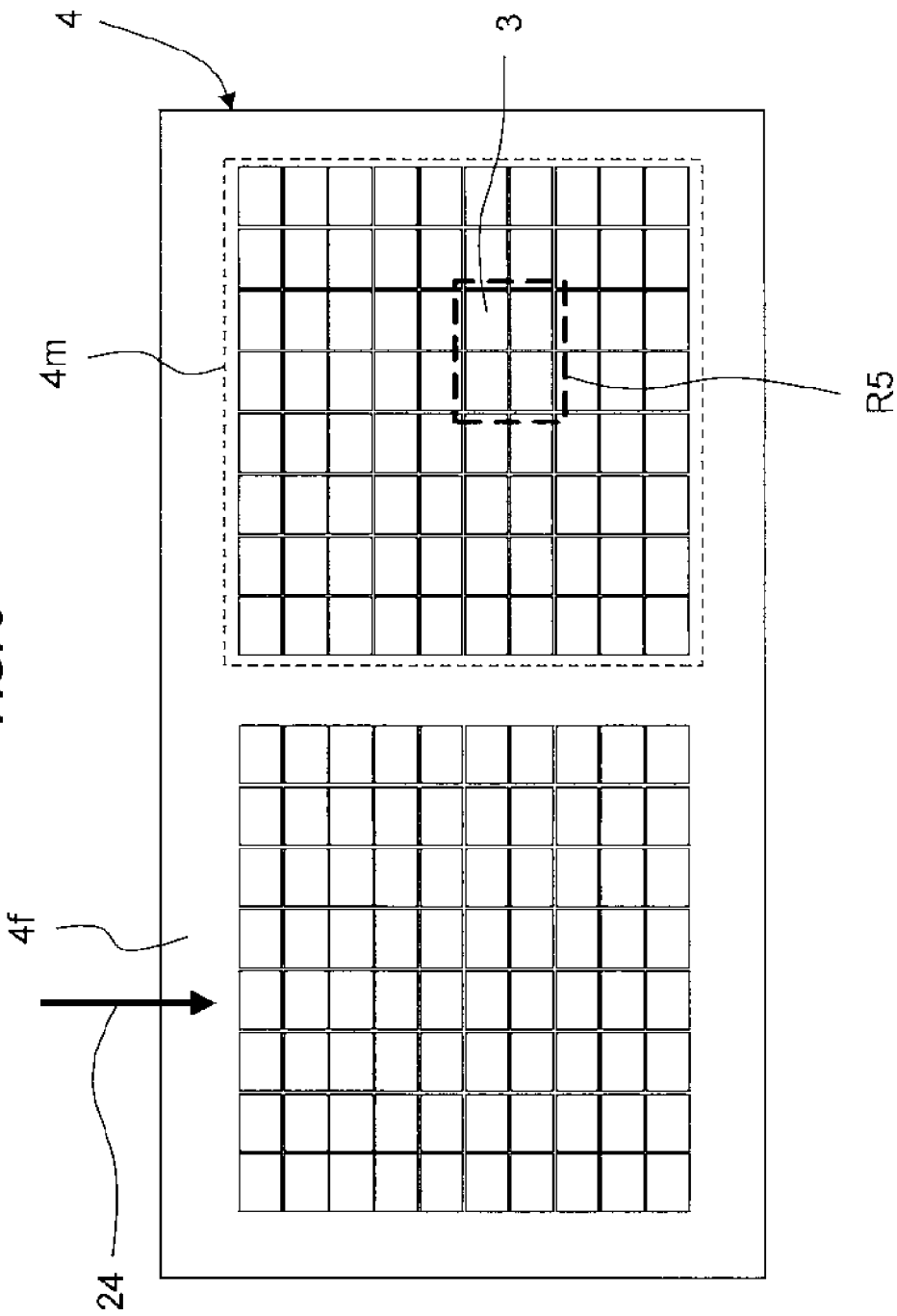
FIG. 9 is an entire plan view of an outline of a lead frame used for the manufacturing method of the semiconductor device of the embodiment of the present application.
Figure 10:
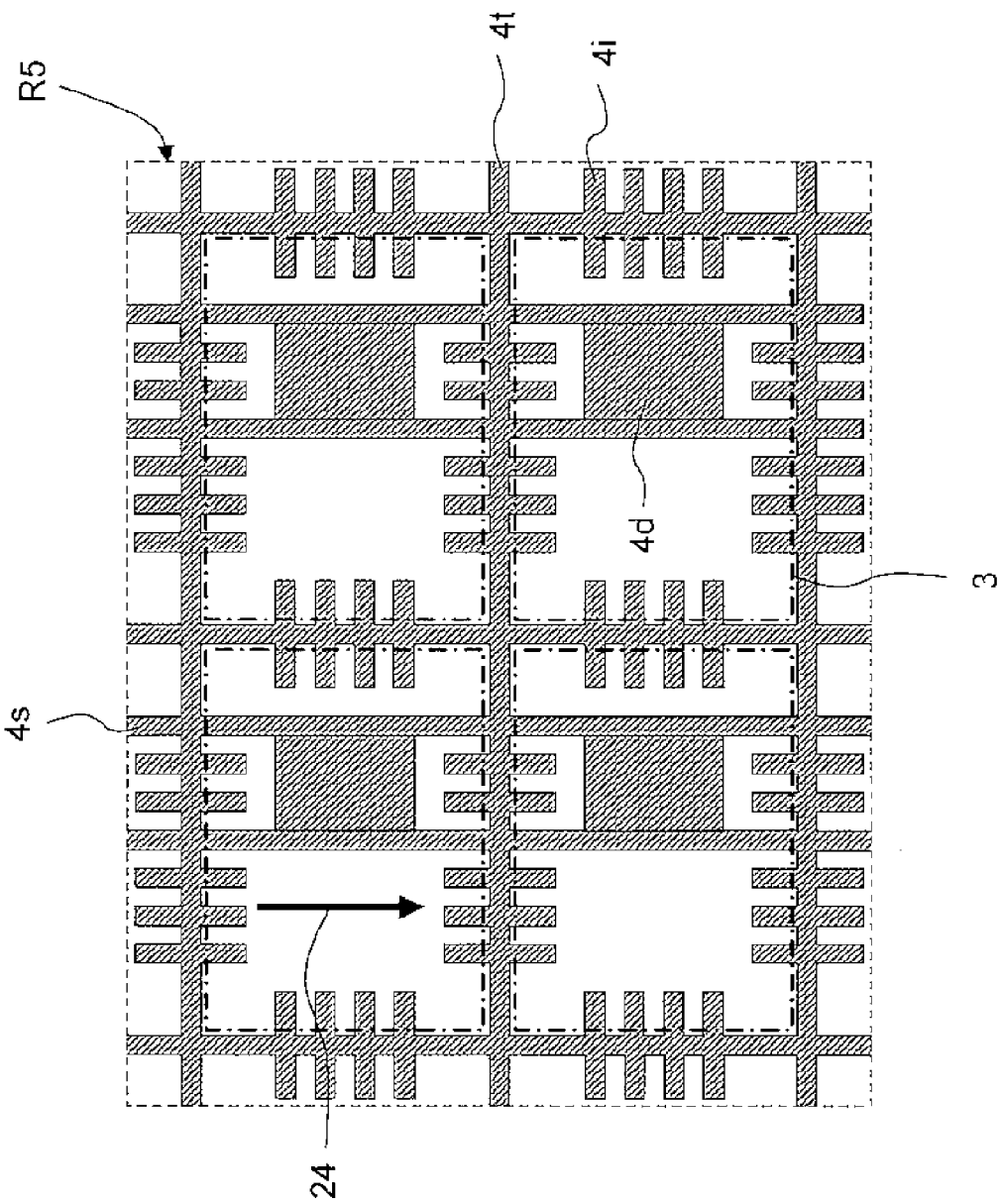
FIG. 10 is a partial enlarged plan view of the lead frame showing a detail of four unit device regions and a peripheral region R5 of these regions in FIG. 9.
Figure 11:
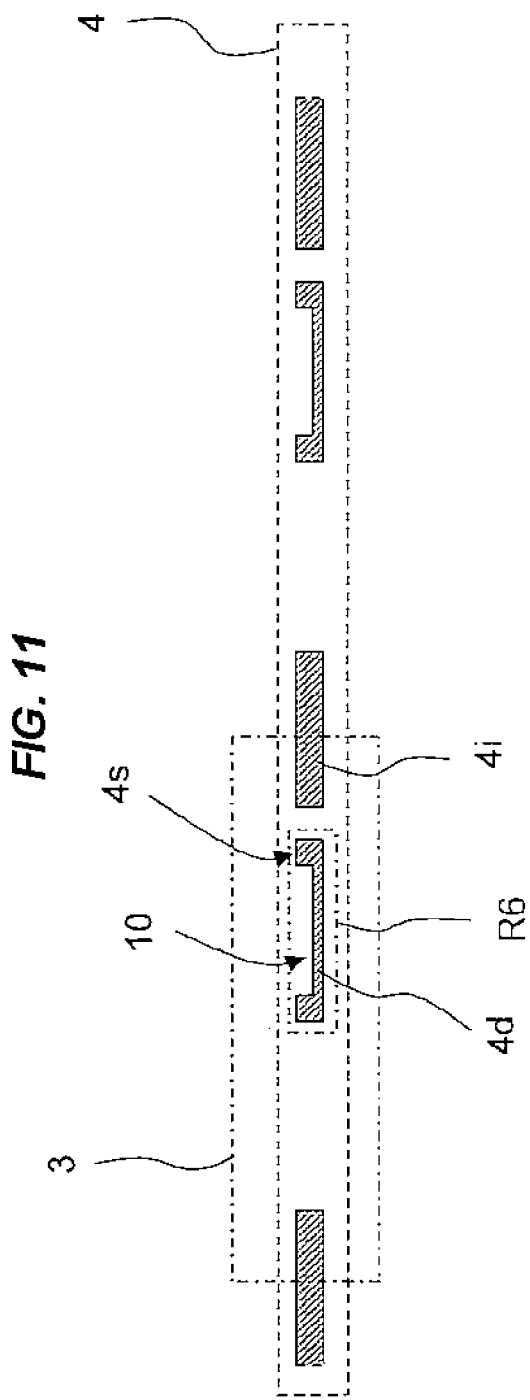
FIG. 11 is a cross-sectional view of a device of a portion (it corresponds to two unit device regions of the lead frame, and hereinafter the same as above) corresponding to FIG. 2 in the middle of a process in the manufacturing method of the semiconductor device in accordance with the embodiment of the present application (a step of preparing the lead frame).
Figure 12:
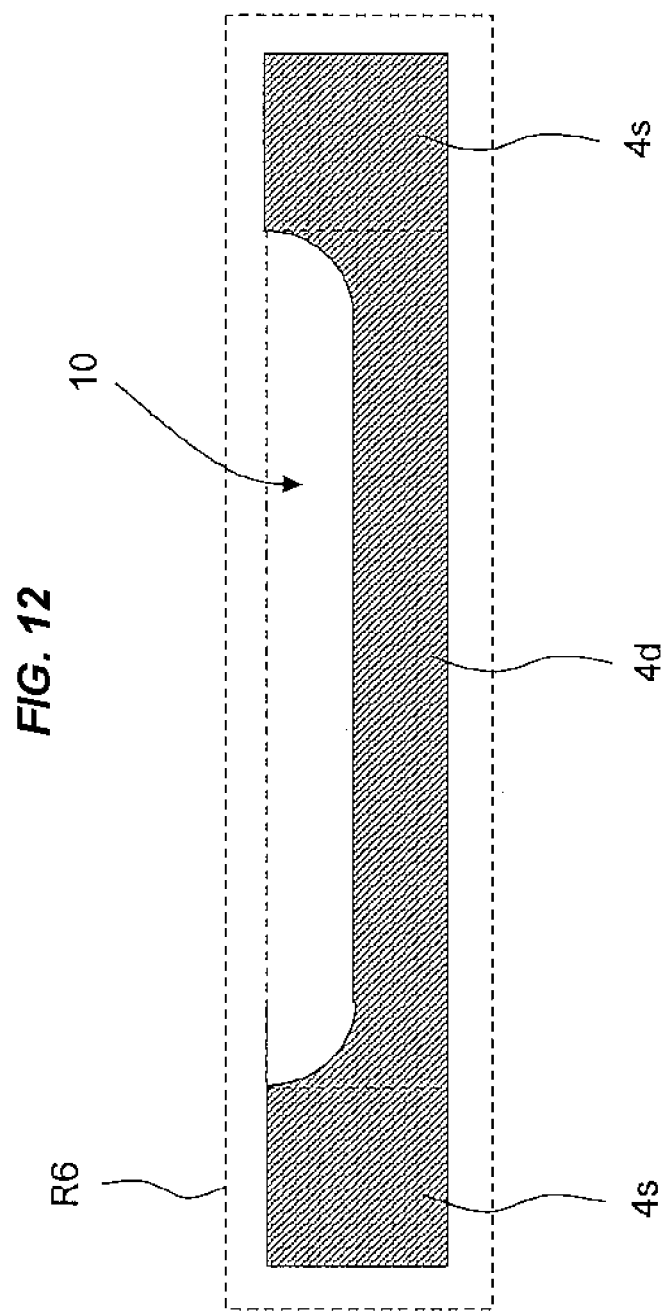
FIG. 12 is an enlarged cross-sectional view of a die pad peripheral region R6 in FIG. 11.
Figure 13:
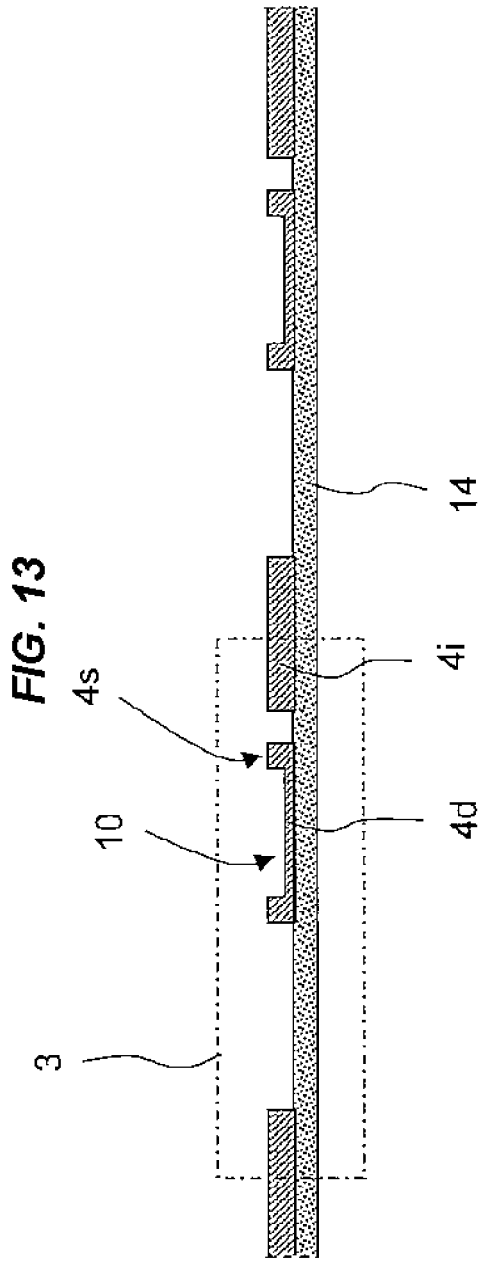
FIG. 13 is a cross-sectional view of a device of the portion corresponding to FIG. 2 in the middle of the process in the manufacturing method of the semiconductor device in accordance with the embodiment of the present application (a step of attaching a tape to a back surface of the lead frame).
Figure 14:
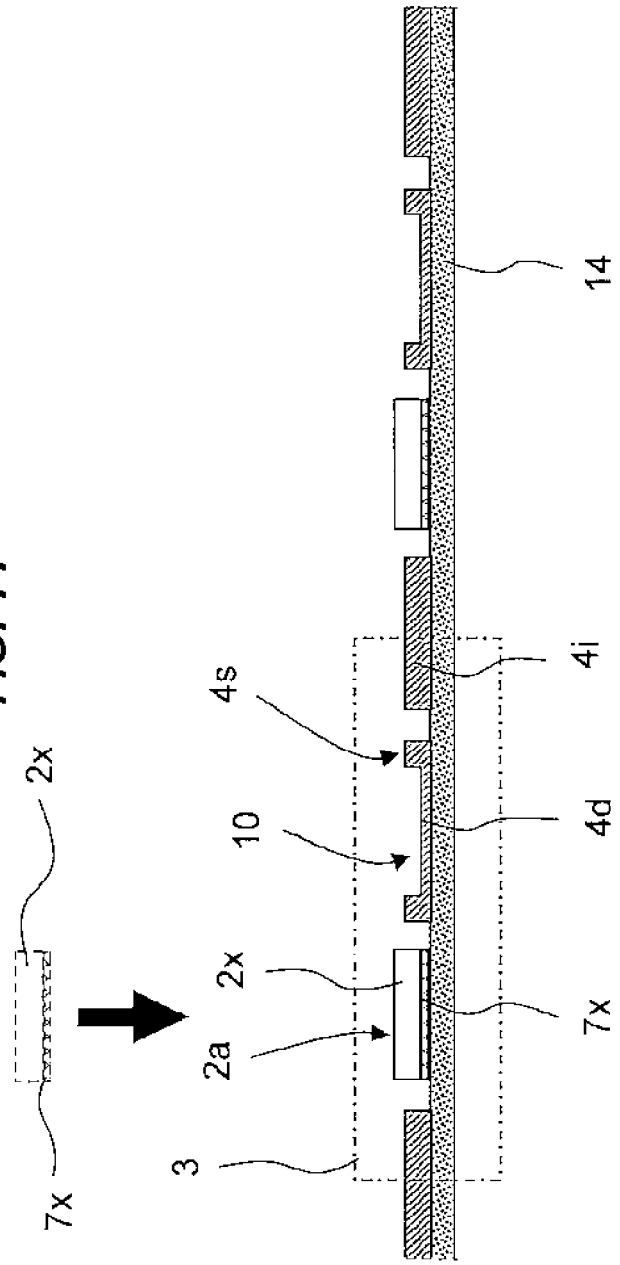
FIG. 14 is a cross-sectional view of a device of the portion corresponding to FIG. 2 in the middle of the process in the manufacturing method of the semiconductor device in accordance with the embodiment of the present application (a step of die bonding a first semiconductor chip).

FIG. 9 is a plan view showing an outline of a lead frame used for the manufacturing method of the semiconductor device in accordance with an embodiment of the present application. FIG. 10 is a partial enlarged plan view of the lead frame showing a detail of four unit device regions and their peripheral region R5 of the lead frame in FIG. 9. FIG. 11 is a cross-sectional view of a device of a portion (it corresponds to two unit device regions of the lead frame, and hereinafter the same as above) corresponding to FIG. 2 in the middle of a process in the manufacturing method of the semiconductor device in accordance with an embodiment of the present application (a step of preparing the lead frame). FIG. 12 is an enlarged cross-sectional view of a die pad peripheral region R6 of FIG. 11. FIG. 13 is a cross-sectional view of a device of the portion corresponding to FIG. 2 in the middle of the process in the manufacturing method of the semiconductor device in accordance with the embodiment of the present application (a step of attaching a tape to a back surface of the lead frame). FIG. 14 is a cross-sectional view of a device of the portion corresponding to FIG. 2 in the middle of the process in the manufacturing method of the semiconductor device in accordance with the embodiment of the present application (a step of die bonding a first semiconductor chip).

Figure 15:
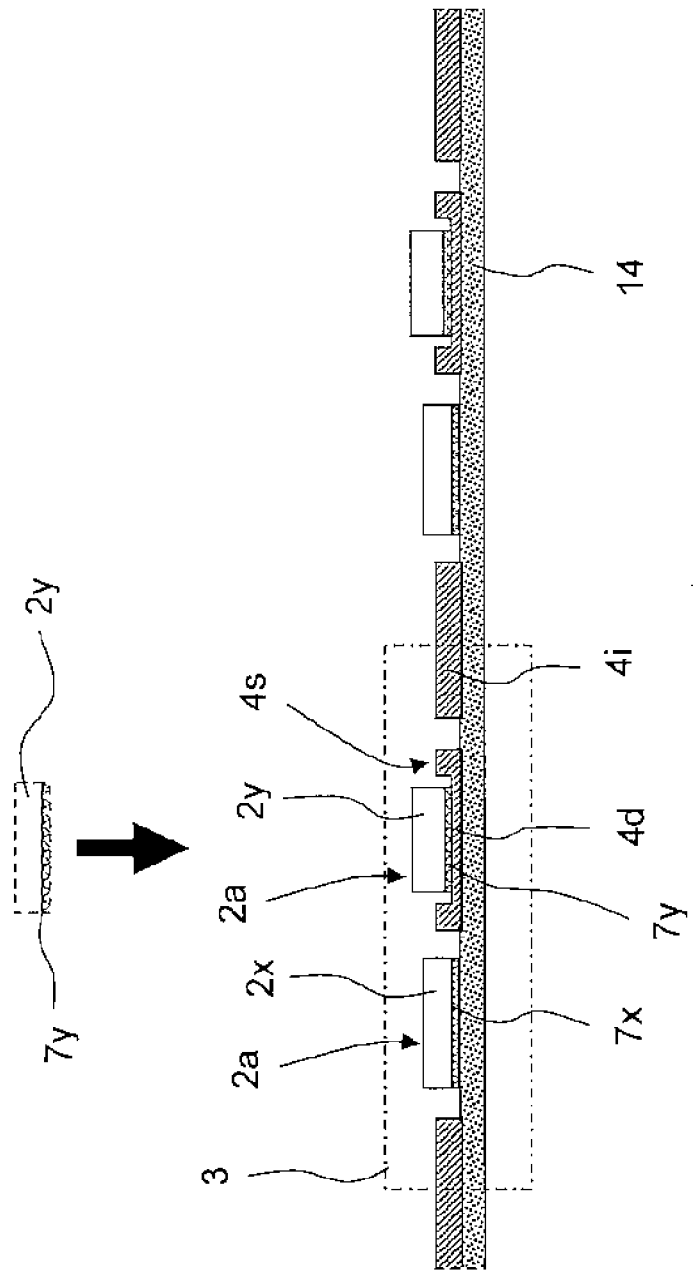
FIG. 15 is a cross-sectional view of a device of the portion corresponding to FIG. 2 in the middle of the process in the manufacturing method of the semiconductor device in accordance with the embodiment of the present application (a step of die bonding a second semiconductor chip).
Figure 16:
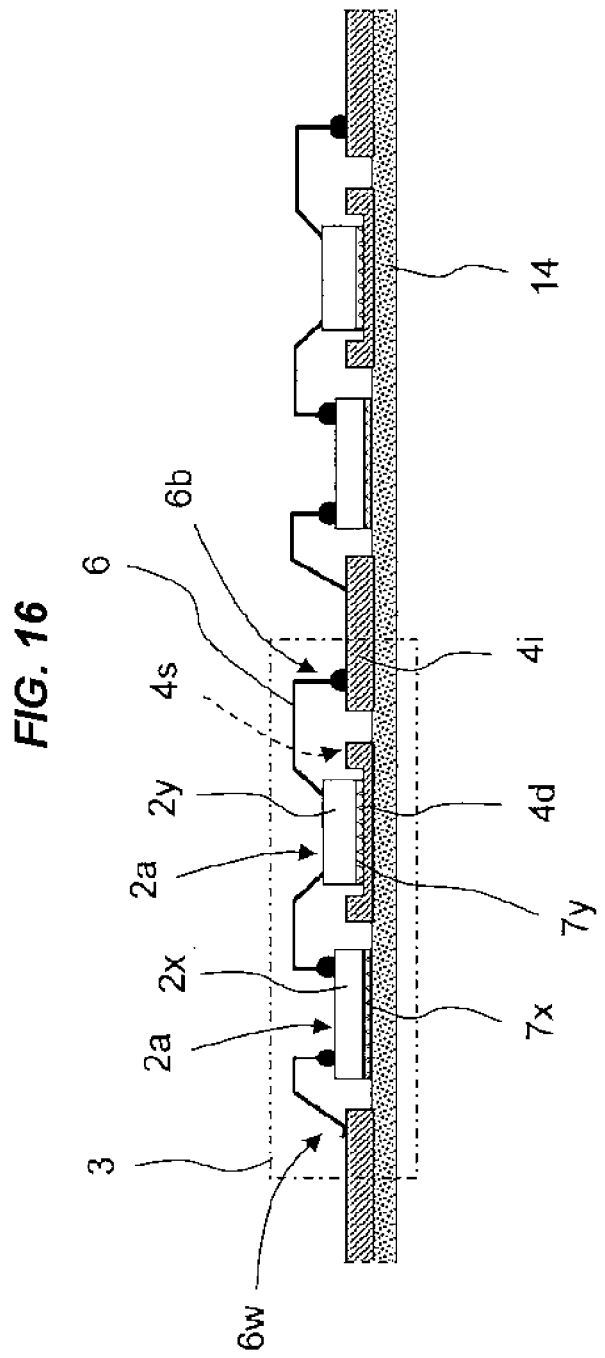
FIG. 16 is a cross-sectional view of a device of the portion corresponding to FIG. 2 in the middle of the process in the manufacturing method of the semiconductor device in accordance with the embodiment of the present application (a step of wire bonding).
Figure 17:
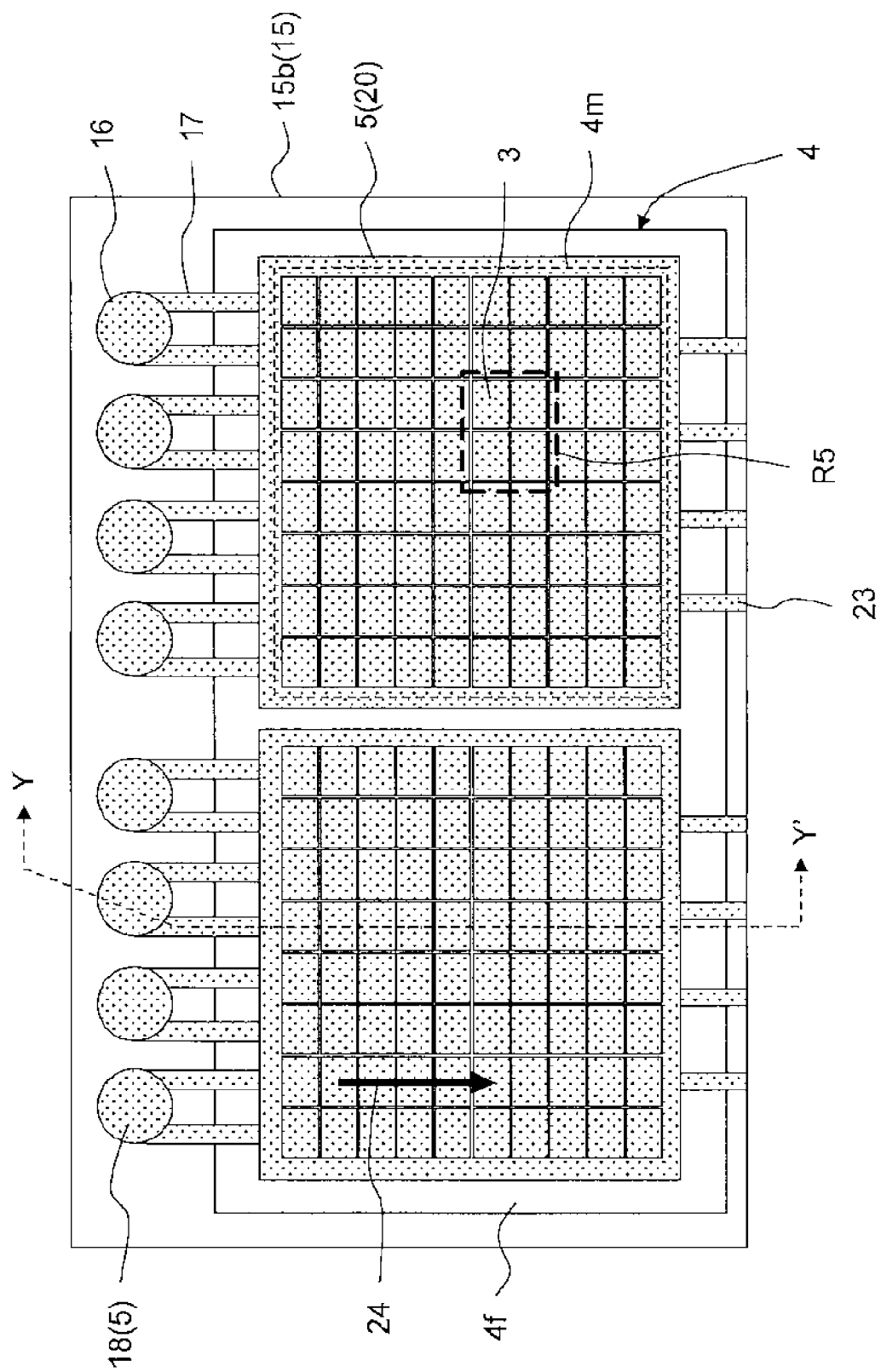
FIG. 17 is a top view of a lead frame over a lower mold corresponding to FIG. 9 in the middle of the process in the manufacturing method of the semiconductor device in accordance with the embodiment of the present application (a step of transfer molding).
Figure 18:
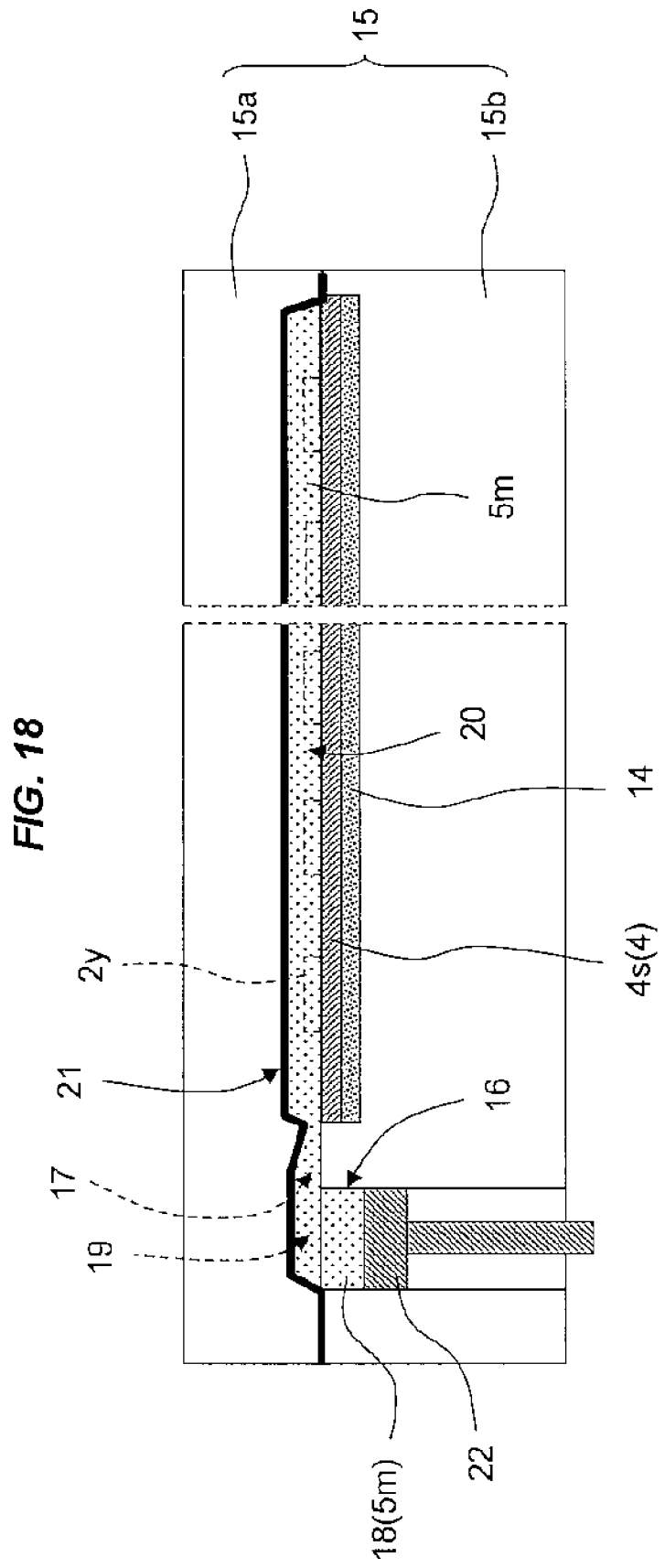
FIG. 18 is a schematic cross-sectional view of a molding mold and the lead frame corresponding to across section taken along a line Y-Y' in FIG. 17.
Figure 19:
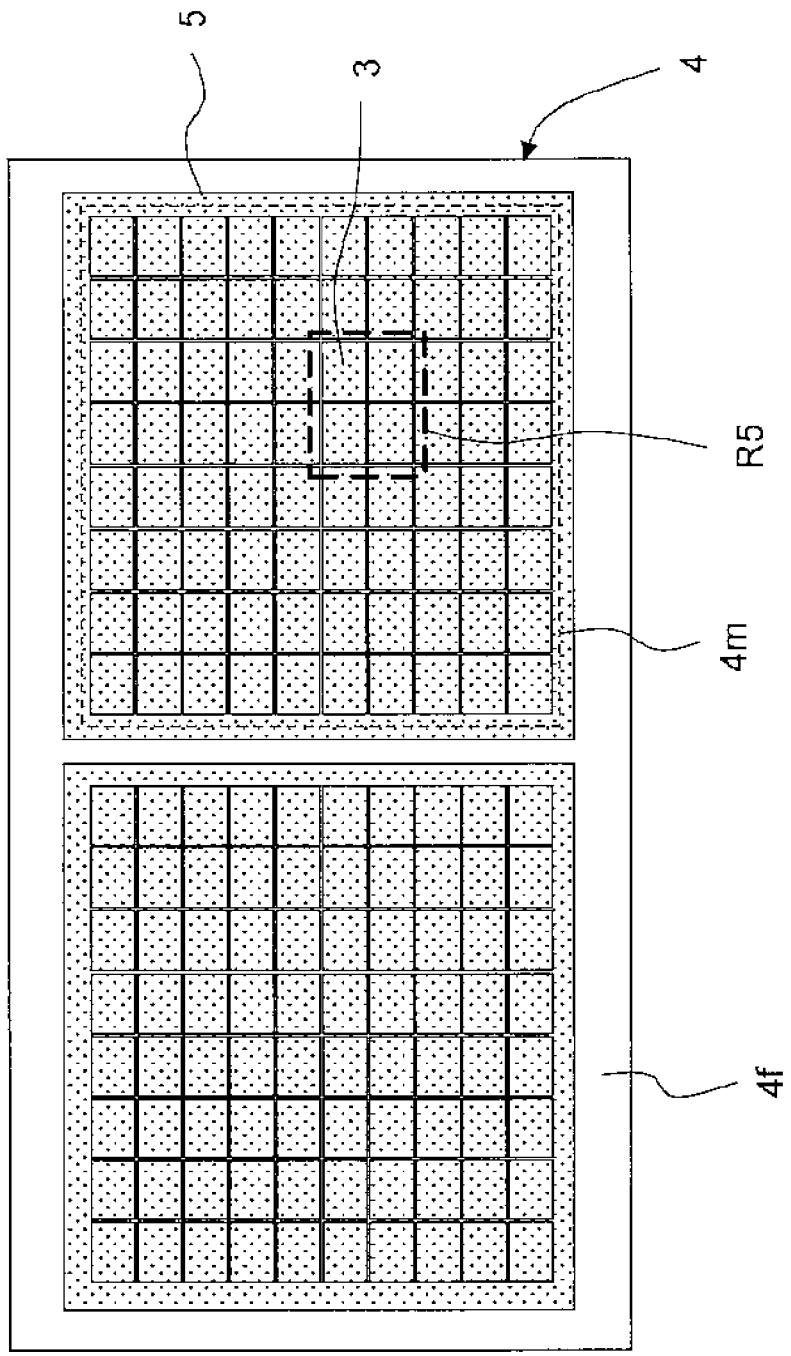
FIG. 19 is a top view of the lead frame over the lower mold corresponding to FIG. 9 in the middle of the process in the manufacturing method of the semiconductor device in accordance with the embodiment of the present application (a step of extracting the lead frame after molding).
Figure 20:
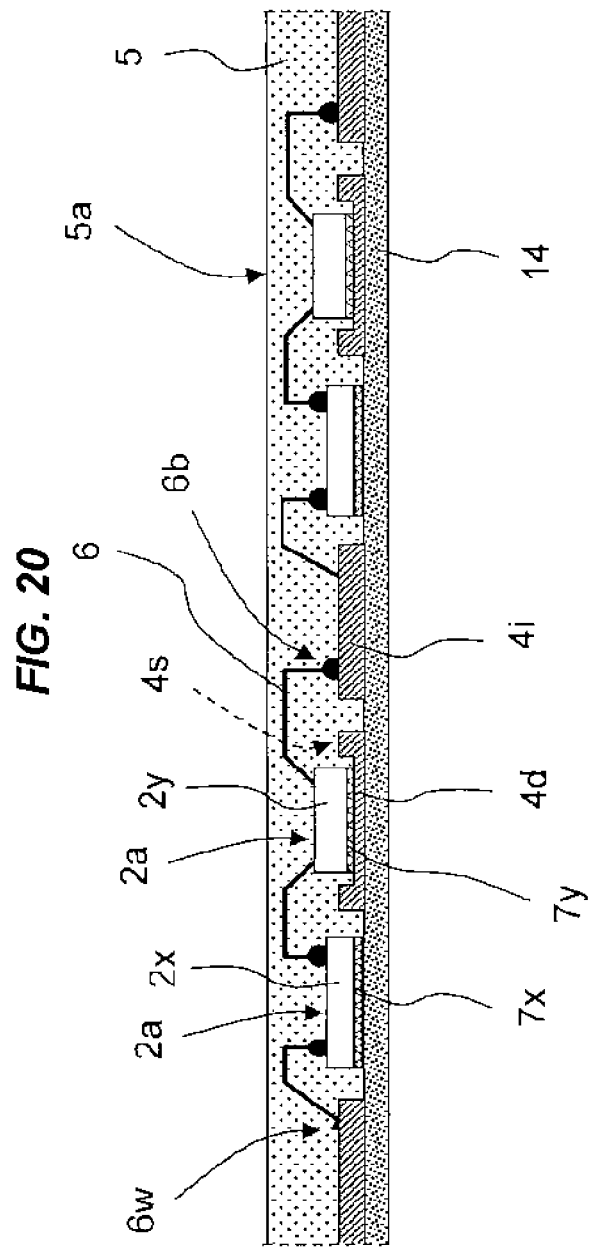
FIG. 20 is a cross-sectional view of a device of a portion corresponding to FIG. 19 in the middle of the process in the manufacturing method of the semiconductor device in accordance with the embodiment of the present application (the step of extracting the lead frame after molding).
Figure 21:
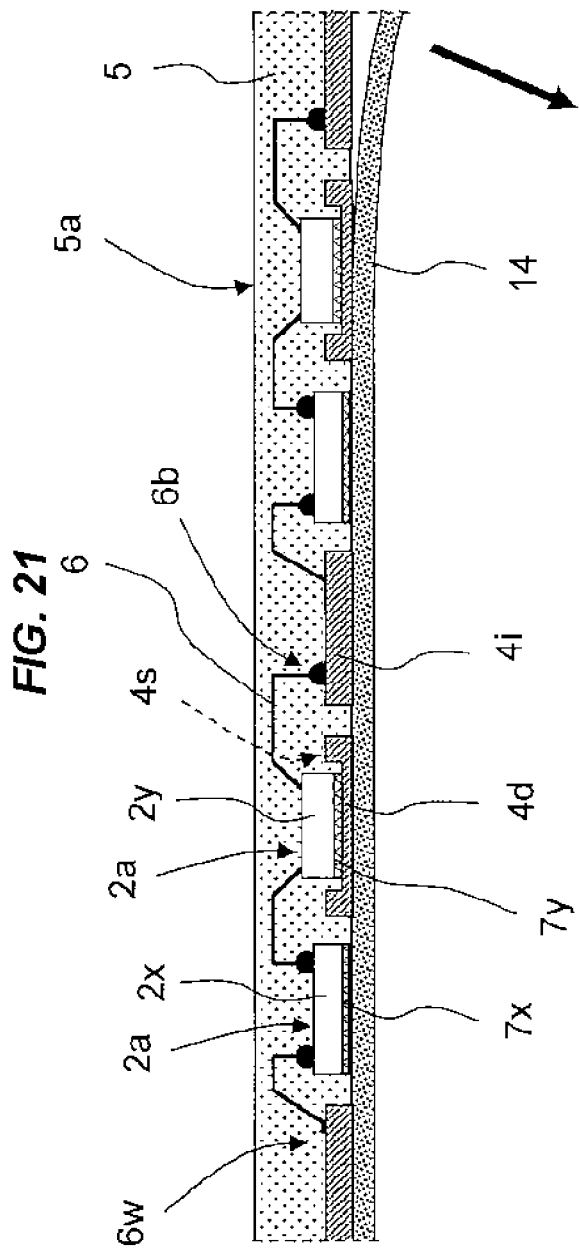
FIG. 21 is a cross-sectional view of a device of the portion corresponding to FIG. 2 in the middle of the process in the manufacturing method of the semiconductor device in accordance with the embodiment of the present application (a step of peeling the tape from the back surface of the lead frame).
Figure 22:
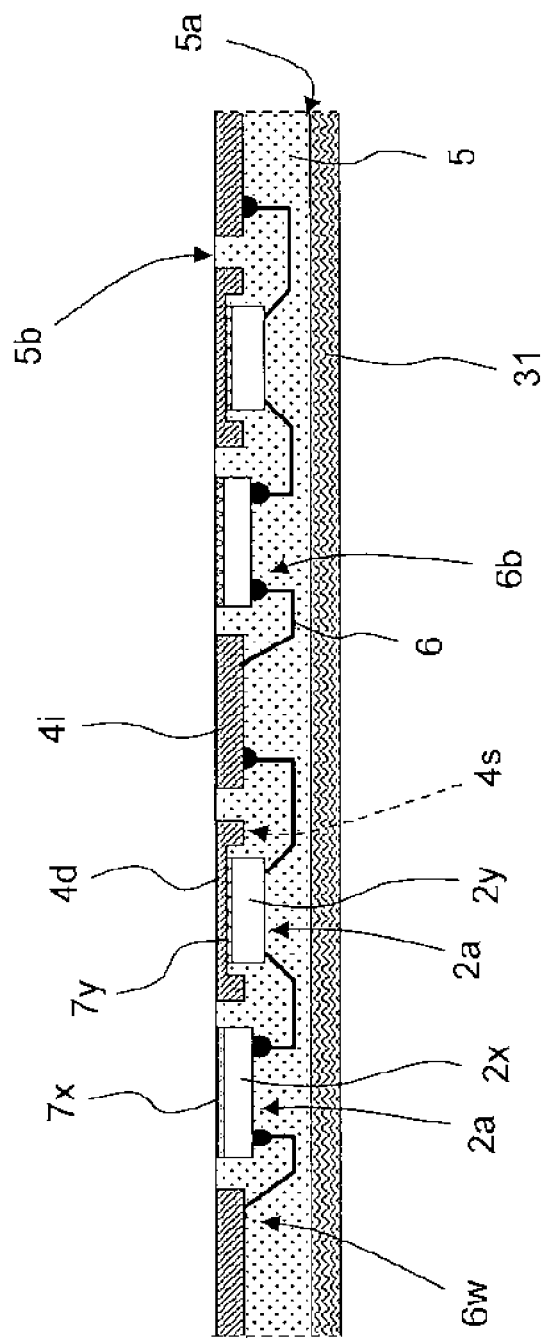
FIG. 22 is a cross-sectional view of a device of the portion corresponding to FIG. 2 in the middle of the process in the manufacturing method of the semiconductor device in accordance with the embodiment of the present application (a step of attaching a dicing tape).
Figure 23:
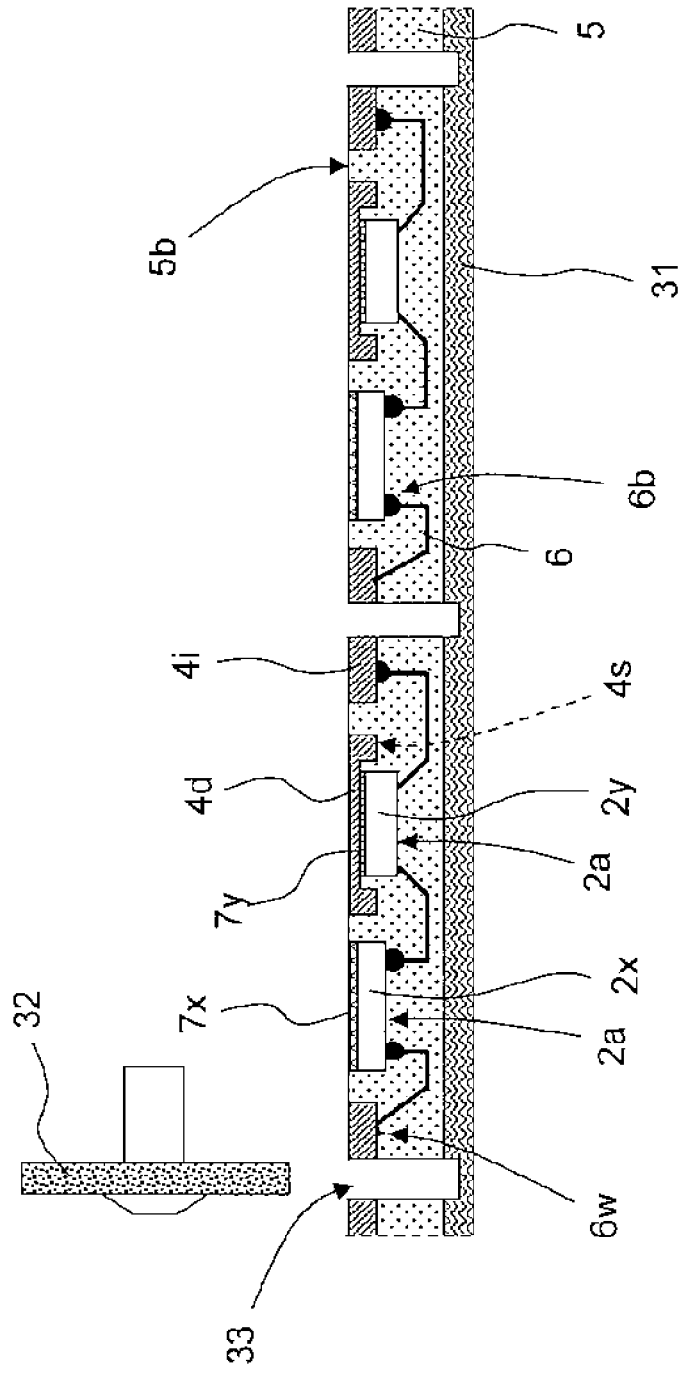
FIG. 23 is a cross-sectional view of a device of the portion corresponding to FIG. 2 in the middle of the process in the manufacturing method of the semiconductor device in accordance with the embodiment of the present application (a step of dicing).

FIG. 15 is a cross-sectional view of a device of the portion corresponding to FIG. 2 in the middle of the process in the manufacturing method of the semiconductor device in accordance with the embodiment of the present application (a step of die bonding a second semiconductor chip). FIG. 16 is a cross-sectional view of a device of the portion corresponding to FIG. 2 in the middle of the process in the manufacturing method of the semiconductor device in accordance with the embodiment of the present application (a step of wire bonding). FIG. 17 is a top view of a lead frame over a lower mold corresponding to FIG. 9 in the middle of the process in the manufacturing method of the semiconductor device in accordance with the embodiment of the present application (a step of transfer molding). FIG. 18 is a schematic cross-sectional view of a molding mold and the lead frame corresponding to a cross section taken along a line Y-Y' in FIG. 17. FIG. 19 is a top view of the lead frame over the lower mold corresponding to FIG. 9 in the middle of the process in the manufacturing method of the semiconductor device in accordance with the embodiment of the present application (a step of extracting the lead frame after molding). FIG. 20 is a cross-sectional view of a device of a portion corresponding to FIG. 19 in the middle of the process in the manufacturing method of the semiconductor device in accordance with the embodiment of the present application (the step of extracting the lead frame after molding). FIG. 21 is a cross-sectional view of a device of the portion corresponding to FIG. 2 in the middle of the process in the manufacturing method of the semiconductor device in accordance with the embodiment of the present application (a step of peeling the tape from the back surface of the lead frame). FIG. 22 is a cross-sectional view of a device of the portion corresponding to FIG. 2 in the middle of the process in the manufacturing method of the semiconductor device in accordance with the embodiment of the present application (a step of attaching a dicing tape). FIG. 23 is a cross-sectional view of a device of the portion corresponding to FIG. 2 in the middle of the process in the manufacturing method of the semiconductor device in accordance with the embodiment of the present application (a step of dicing). Based on the above-mentioned drawings, the manufacturing process in the manufacturing method of the semiconductor device in accordance with the embodiment of the present application is explained.

First, a lead frame 4 (oxygen-free copper) in FIGS. 9 to 12 is prepared. A structure of the lead frame 4 is simply explained. As shown in FIGS. 9 to 12, the lead frame 4 includes a peripheral frame portion 4f, one or more unit device region matrix portion(s) 4m in an inner region. Each unit device region matrix portion 4m includes a number of (a plurality of) unit device regions 3 arranged in a matrix form. The flow direction 24 of the sealing resin at transfer molding is shown with the arrow in FIGS. 9 and 10.

As shown in FIG. 10, which is a partially enlarged view of FIG. 9, the die pad support lead 4s (the tab suspension lead) extends linearly over all the unit device regions 3 of the same column across a border of one unit device region 3 in approximately the same direction as the flow direction 24 of the sealing resin. Approximately the same as each other are a position of the die pad support leads 4s in one unit device region 3 and that of the die pad support leads 4s of another unit device region 3 that is adjacent to one long side in the unit device region 3 between the die pad support leads 4s. Such a configuration allows a resin flow passage of a longitudinal direction to be smooth along with a tie bar 4t extending in the longitudinal direction.

Next, as shown in FIG. 12, the recess portion 10 (its depth is about 70 micrometers) of the surface of the die pad 4d is formed by chemical etching such as wet etching.

Next, as shown in FIG. 13, a lead frame back surface tape 14, such as a polyimide adhesive tape, with a thickness of about 30 micrometers is attached to approximately the whole surface of the back surface of the lead frame 4. The lead frame 4 having the lead frame back surface tape 14 attached to its back surface may be prepared from the beginning.

Next, as shown in FIGS. 14 and 15, the semiconductor chip 2x and the semiconductor chip 2y are sequentially die-bonded over the lead frame back surface tape 14 and over the surface of the die pad 4d via the DAF members 7x and 7y previously adhered to a back surface of each of the chips 2x and 2y. Any of the semiconductor chip 2x and the semiconductor chip 2y may be die-bonded first, or both of them may be simultaneously die-bonded. A material of the DAF members 7x and 7y should be preferably adhesive with a property similar to epoxy sealing resin including carbon black as a colorant as used in a latter molding step. (This is not an essential requirement.) Although coating type adhesive may be used for either of the chips or both of them instead of using the DAF members 7x and 7y, it is convenient that the single DAF can be attached to a back surface of a wafer in a wafer stage, and a separating processing can be collectively performed by wafer dicing when the DAF member is used.

Next, as shown in FIG. 16, ball and wedge bonding of a thermosonic method is carried out by using bonding tools such as the gold bonding wire 6, a wire bonding apparatus, and the capillary. At this time, although the ball and wedge bonding is carried out as a forward direction bonding of the chip 2x, it may be carried out as a forward direction bonding of the chip 2y, and any bonding may be freely selected for the each wire. It is preferable from viewpoints of reliability that wedge bonding should be performed after the stud bump is previously formed by using the bonding tools such as the same or another wire bonding apparatus and the capillary, when wedge bonding is performed over the chip (The stud bump may be omitted).

Next, as shown in FIGS. 17 and 18, the lead frame 4 (a lead frame and chip composite body) in which wire bonding is completed is stored in a mold cavity 20 in a molding mold 15 (it includes a lower mold 15b and an upper mold 15a) heated to about 175 degrees C., and then transfer molding is carried out. The lead frame 4 and a resin tablet 18 are stored in the mold cavity 20 and a pot portion 16 of the lower mold 15b, respectively, and the bottom surface is closed with the upper mold 15a having a vacuum-adsorbed mold releasing film 21 (a release film) to clamp the mold 15. Subsequently, a plunger 22 rises in a state where the mold 15 is clamped, and molten resin (resin) 5m is supplied to the mold cavity 20 through a cull portion 19, a runner and gate portion 17. Additionally, the molten resin 5m supplied in the mold cavity 20 flows in the mold cavity 20 as the arrow 24 (the flow direction of the sealing resin), and fills an inside of the mold cavity 20, and a part of it reaches an air vent 23. At this time, as shown in FIG. 1, the molten resin 5m flows in a direction intersecting (approximately intersecting at a right angle) with an extending direction of the bonding wire group 6a1 that electrically connects the bonding pad group 9g1 formed over the surface of the semiconductor chip 2x and the bonding pad group 9g1 formed over the surface of the semiconductor chip 2y, respectively. Subsequently, when curing in the mold 15 is completed, the mold 15 is opened, and the sealed lead frame 4 (the lead frame and chip composite body) is extracted as shown in FIGS. 19 and 20.

Next, as shown in FIG. 21, the lead frame back surface tape 14 is peeled. At this time, the adhesive layer 7x (the first adhesive layer) of the back surface of the chip 2x (the first chip) remains on the first chip 2x.

Subsequently, as shown in FIG. 22, a dicing tape 31 is adhered to a surface side 5a of the resin sealing body 5 formed over the lead frame 4. The lead frame back surface tape 14 may be peeled after adhesion of the dicing tape 31.

Next, as shown in FIG. 23, a dicing groove 33 is formed in an X and a Y directions by a rotating blade 32 (a dicing blade) (usually, a full cutting method is applied, and the dicing groove reaches the dicing tape 31). Subsequently, the lead frame 4 is separated into an individual device (package) corresponding to the unit device region 3 (the unit package 1) by separating from the dicing tape 31. Then the device in FIGS. 1 and 2 is formed.

3. Explanation of various modified examples of the target device structure in the manufacturing method of the semiconductor device of the one embodiment of the present application (mainly from FIGS. 24 to 26)

In this section, a modification of a layout in FIG. 1 shown in section 1 is explained. The manufacturing process can be carried out approximately similarly to the explanation of section 2.

Figure 24:
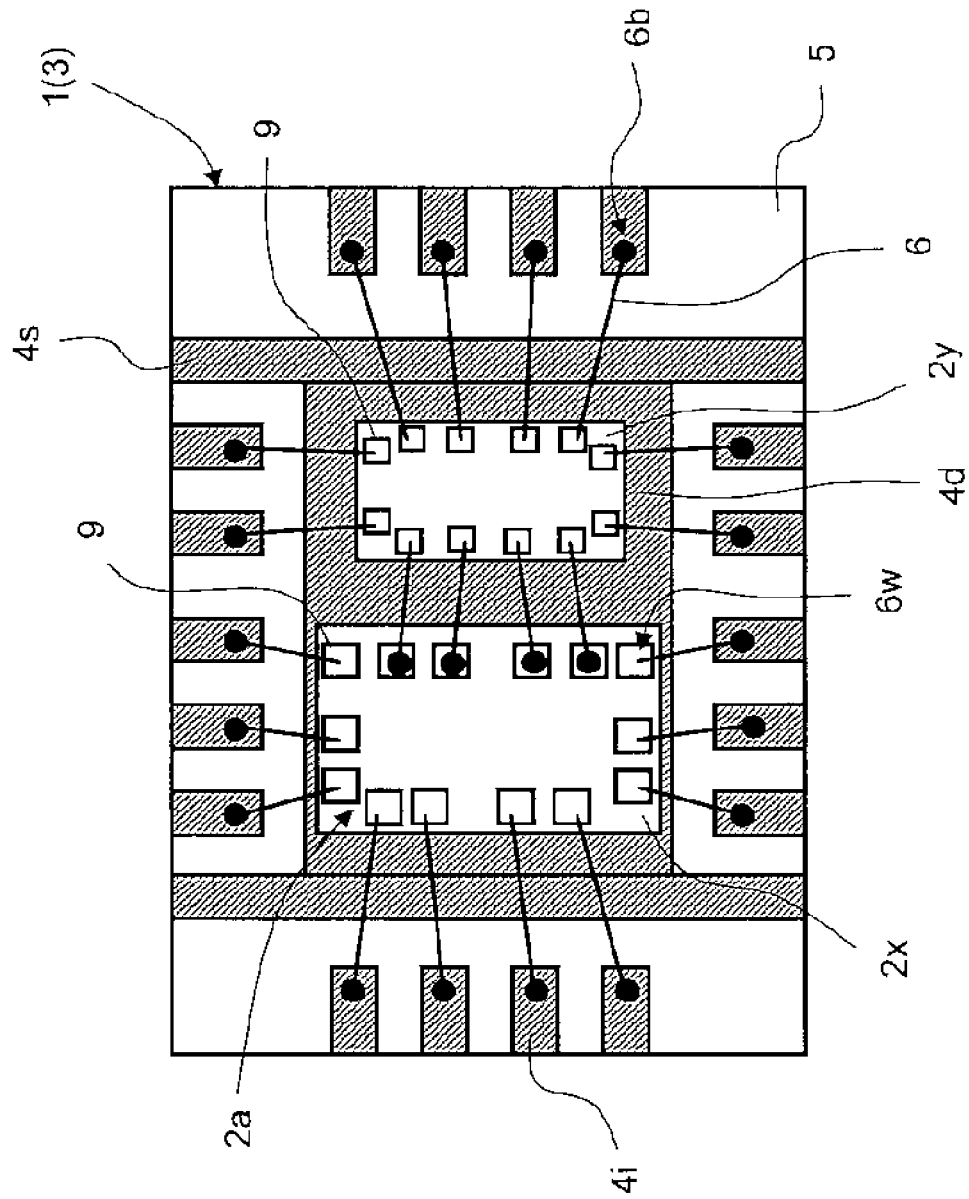
FIG. 24 is a top view of a device (package) corresponding to FIG. 1 showing a modified example (the device having leads at four sides and having all chips mounted over a die pad) of a target device structure in the manufacturing method of the semiconductor device in accordance with the embodiment of the present application.
Figure 25:
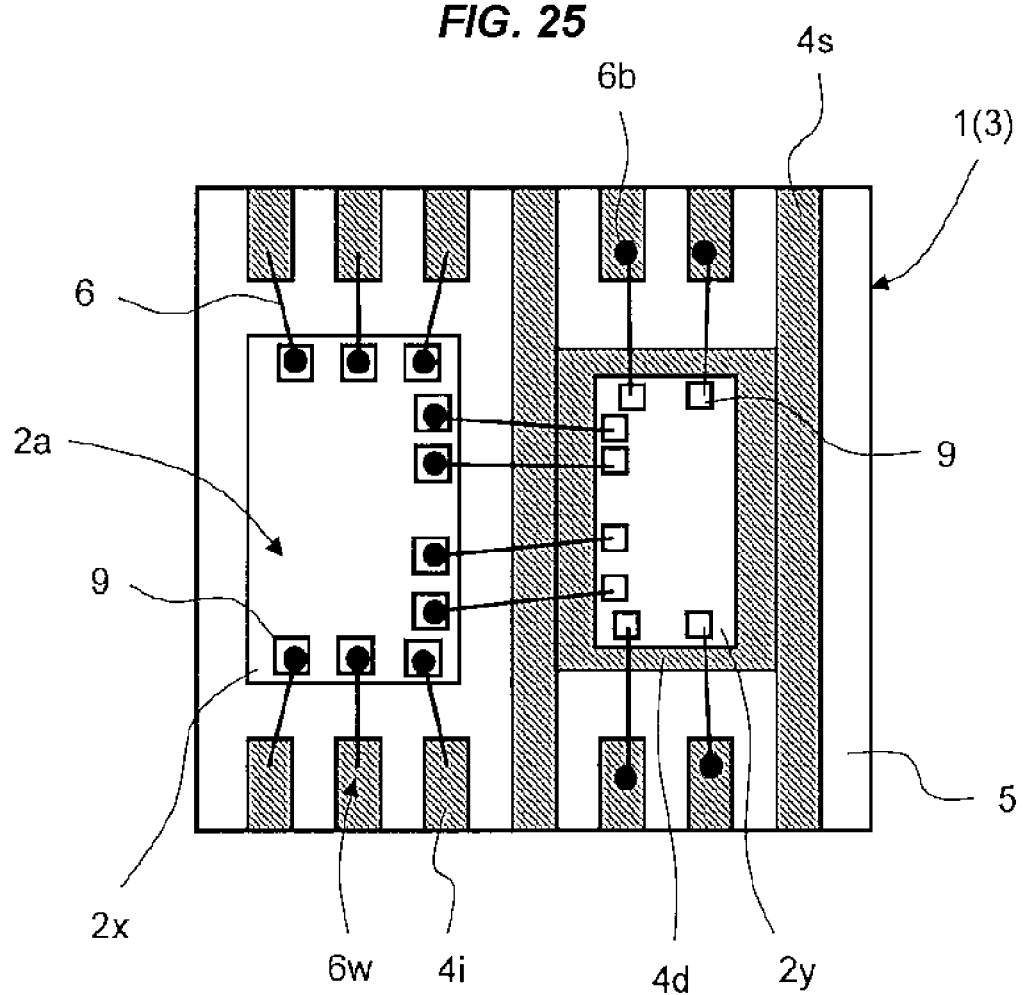
FIG. 25 is a top view of a device (package) corresponding to FIG. 1 showing a modification (the device having leads at two sides and having one chip mounted over a die pad) of the target device structure in the manufacturing method of the semiconductor device in accordance with the embodiment of the present application.
Figure 26:
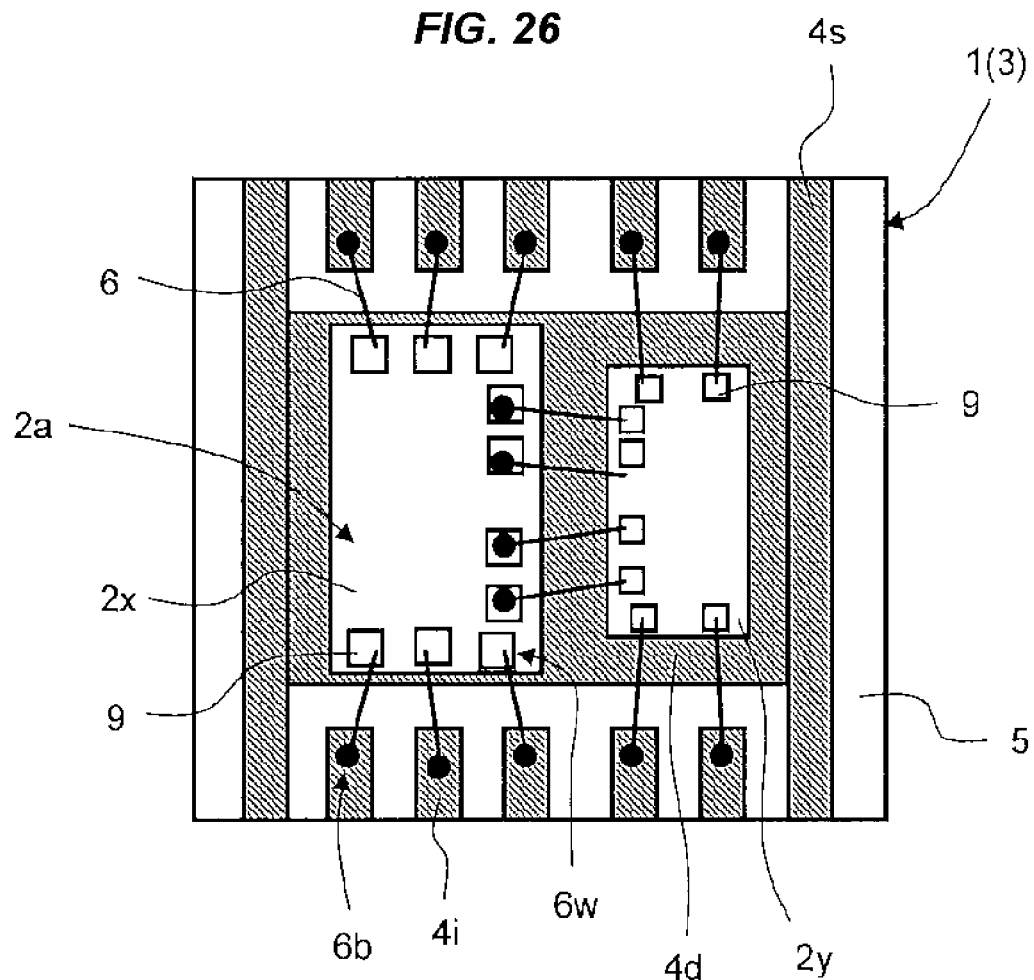
FIG. 26 is a top view of a device (package) corresponding to FIG. 1 showing a modification (the device having leads at two sides and having all chips mounted over a die pad) of the target device structure in the manufacturing method of the semiconductor device in accordance with the embodiment of the present application.

FIG. 24 is a top view of a device (package) corresponding to FIG. 1 showing a modification 1 (the device having leads at four sides and having all chips mounted over a die pad) of the target device structure in the manufacturing method of the semiconductor device in accordance with the embodiment of the present application. FIG. 25 is a top view of a device (package) corresponding to FIG. 1 showing a modification 2 (the device having leads at two sides and having one chip mounted over the die pad) of the target device structure in the manufacturing method of the semiconductor device in accordance with the embodiment of the present application. FIG. 26 is a top view of a device (package) corresponding to FIG. 1 showing a modification 3 (the device having leads at two sides and having all chips mounted over the die pad) of the target device structure in the manufacturing method of the semiconductor device in accordance with the embodiment of the present application. Based on the above-mentioned drawings, various modified examples of the target device structure in the manufacturing method of the semiconductor device of the one embodiment of the present application are explained.

(1) The modification 1 in which all the chips are located over the die pad, and connection leads are located at four sides of the package (mainly in FIG. 24)

In this modification, both the pairs of semiconductor chips 2x and 2y are die-bonded over the die pad 4d unlike FIG. 1. Like in FIG. 1, a plurality of chips is arranged in the longitudinal direction of the package (the extending direction of the long side) (the chips are not stacked). However, if a stacked chip is approximately as thick as the other single chip, the fact that some or all of a plurality of chips stored are stacked chips is not excluded.

Although the semiconductor chip 2x is thicker than that of the semiconductor chip 2y to keep a chip strength for attaching it outside the die pad 4d, the semiconductor chips 2x and 2y can be approximately as thick as each other (the thickness is about 110 micrometers) since it is not necessary to have the same thicknesses as in the example of FIG. 1. Since a compound semiconductor chip generally is weaker than a silicon semiconductor chip, the semiconductor chip 2x can also be a little thickened (the thickness is about 120 micrometers). As described above, when a layout is designed in which two or more chips are die-bonded over the die pad 4d of a plurality of chips, an area of a frame constituted by the comparatively wider die pad 4*d* and the die pad support lead 4*s* (the tab suspension lead) becomes wider. This can reduce warpage of the package, which is easily generated in a rectangular package.

(2) The modification 1 in which one chip is located over the die pad, and the connection leads are located only at the pair of long sides of the package (mainly in FIG. 25)

The package may be a SON (Small Outline Non-lead) type package (semiconductor device) in which the connection leads 4*i* are aligned only at the pair of long sides of the rectangular package unlike in FIG. 1.

(3) The modification 1 in which all the chips are located over the die pad, and the connection leads are located only at the pair of long sides of the package (mainly in FIG. 26)

In this modification, the connection leads 4*i* are aligned only at the pair of long sides of the rectangular package unlike the example of FIG. 24 (similar to FIG. 25). In addition, since an area of a frame constituted by the comparatively wider die pad 4*d* and the die pad support lead 4*s* (the tab suspension lead) occupies almost all the portions of the package, warpage of the package, which is easily generated in the rectangular package, can be significantly reduced.

4. Consideration and supplementary explanation for the embodiment

In this section, general consideration and supplementary explanation are given, concerning the invention in the present application, the previously described embodiment, and the modifications.

As shown in FIG. 1 and FIGS. 24 to 26, when a plurality of chips is stored and a package shape is intended to be as thin as possible, the chips are arranged in a direction of a long axis (long side) of the package 1, and thus a planar shape of the package 1 is usually a rectangle. From a viewpoint of thinning the package, it can also be considered that the die pad 4*d* against the thinning is eliminated, and all the chips 2*x* and 2*y* are directly die-bonded. However, generally, warpage (internal stress) tends to be generated in a long side direction of the rectangular package 1, and the rectangular package 1 cannot withstand the warpage (internal stress) if it has a structure without the die pad 4*d* and the die pad support lead 4*s*. Accordingly, in each of the above-mentioned embodiments, the top surface of the die pad 4*d* is half-etched, and the die pad 4*d* is thinned more than the connection lead 4*i* and the die pad support lead 4*s*. It is because the die pad support lead 4*s* is not thinned similarly to that of the die pad 4*d* that a strength of the package 1 is kept and generation of warpage (internal stress) is reduced. This does not eliminate partially thinning a part of the die pad support lead 4*s* and the connection lead 4*i* for other purpose.

In addition, it is necessary to interconnect between the chips by the bonding wire in the multichip module as in each of the above-mentioned embodiment, and the interconnection wire between the chips inevitably approximately intersects at a right angle with the extending direction of the long sides of the rectangular package 1 because of a chip array along the extending direction of the long sides of the rectangular package 1. Accordingly, from a viewpoint of wire sweep at transfer molding of the interconnection wire between the chips, a flow of the sealing resin may be considered to be formed in a direction along the extending direction of the long sides of the rectangular package 1.

However, wire sweep of the bonding wire between the connection leads 4*i* arranged along the long sides of the rectangular package 1 and the chips 2*x* and 2*y* also cannot be ignored. Furthermore, a void may frequently occurs when the sealing resin flows in a direction intersecting at a right angle with the die pad support leads 4*s* arranged to connect the pair of long sides of the rectangular package 1 to each other. The flow of the sealing resin is disrupted when crossing over the die pad support leads 4*s* across the full width, and then causes the void.

Meanwhile, as each of the above-mentioned embodiments, when sealing resin is introduced from one side of the pair of long sides of the rectangular package 1, and the main flow direction of the sealing resin in the cavity 20 (refer to FIG. 17) intersects with at the pair of long sides approximately at a right angle (a resin flow direction along a short side direction of the rectangular package 1), the molten resin 5*m* (refer to FIG. 18) flows comparatively without being disrupted in a flow-passage-shaped region partitioned by the thin die pad 4*d* and the comparatively thick die pad support leads 4*s* (outside the one of the die pad support leads 4*s*, between the both die pad support leads 4*s*, and outside the other of the die pad support leads 4) (nothing like the die pad support leads 4*s* that embrace the full width of the flow passage exists).

Although such a relation between the flow direction of the introduced sealing resin and the extending direction of the die pad support lead 4*s* is effective also in the individually sealing method, it has a larger effect in the collectively sealing method as shown in the above-mentioned embodiment. As can be seen from FIG. 1, when focusing on the unit region 3 having the lead frame 4, positions of the die pad support leads 4*s* of the unit device region 3 are arranged to approximately match those of the die pad support leads of the adjacent unit device region that is adjacent with one long side in the unit device region 3 therebetween (the long side located on the side to which the sealing resin is supplied). The sealing resin flows comparatively without being disrupted along the flow passage constituted by a plurality of die pad support lead columns (a linear long lead or a bar constituted by the die pad support leads belonging to each unit device region aligning in the longitudinal direction) that approximately penetrate longitudinal directions in all the longitudinal directions of the lead frame 4.

In addition, in FIG. 1 or 25, the first semiconductor chip 2*x* is directly die-bonded because the compound semiconductor chip, which is mechanically weak, generally is comparatively thicker than the silicon semiconductor chip (the second semiconductor chip 2*y*). In addition, also in a case where the first semiconductor chip 2*x* and the second semiconductor chip 2*y* are as thick as each other, when a comparatively large conductive body (a metal body equal to or larger than the chip) is close in a device that deals with a radio-frequency as an antenna switch, the conductive body has an undesirable capacity component or an inductance component. Thus the chip is die-bonded directly outside the die pad 4*d* to avoid them.

5. Summary

Although the invention made by the present inventor has been specifically explained based on the embodiments, the invention in the present application is not limited to the embodiments. The embodiments can be changed variously without departing from the gist of the invention.

Although the invention in the present application has been specifically explained by mainly mentioning non-lead type package in the above-mentioned embodiments, the invention in the present application is not limited to the package. The invention can be applied also to other packages.

In addition, although the invention in the present application has been specifically explained by mainly mentioning the high frequency antenna module (the multichip module) in the above-mentioned embodiments, the invention in the present application is not limited to the module. The invention can be applied to a multichip module for other applications. Furthermore, a combination of mounted chips is not limited to that of the silicon semiconductor chip and the GaAs semiconductor chip (the compound semiconductor chip). A combination of silicon chips or that of the silicon chip and other compound semiconductor chip may also be used.

Although the manufacturing process of the invention in the present application has been specifically explained by mentioning the MAP (Mold Array Package) process in the above-described embodiments, the invention in the present application is not limited to the process. The invention can be applied also to an individually sealing type packaging process.

What is claimed is:

1. A manufacturing method of a semiconductor device comprising the steps of:
    (a) providing a lead frame having a plurality of unit device regions including a plurality of connection leads, a die pad, and a plurality of die pad support leads which are thicker than the die pad and that support the die pad, a shape in a plan view of each of the unit devices being a rectangle;
    (b) arranging a first semiconductor chip having a plurality of bonding pads in each of the unit device regions;
    (c) arranging a second semiconductor chip having plurality of bonding pads over a front surface of the die pad of each of the unit device regions such that the second semiconductor chip is aligned with the first semiconductor chip along a long side of each of the unit device regions;
    (d) electrically connecting a first bonding pad group of the bonding pads of the first semiconductor chip and that of the second semiconductor chip, respectively, via a first bonding wire group, in each of the unit device regions;
    (e) electrically connecting a second bonding pad group of the bonding pads of the first semiconductor chip and a first connection lead group of the connection leads, respectively, via a second bonding wire group;
    (f) electrically connecting a second bonding pad group of the bonding pads of the second semiconductor chip and a second connection lead group of the connection leads, respectively, via a third bonding wire group; and
    (g) after the steps (d), (e), and (f), forming a resin sealing body by sealing the unit device regions with sealing resin,
    wherein the die pad support leads connect between one and the other of a pair of long sides facing to each other in each of the unit device regions, and
    wherein the sealing resin in the step (g) is supplied from the one side toward the other side of the pair of long sides.

2. The manufacturing method of the semiconductor device according to claim 1,
    wherein a back surface of the die pad is exposed from the resin sealing body.

3. The manufacturing method of the semiconductor device according to claim 2,
    wherein back surfaces of the connection leads are exposed from the resin sealing body.

4. The manufacturing method of the semiconductor device according to claim 3,
    wherein the connection leads is approximately as thick as the die pad support leads.

5. The manufacturing method of the semiconductor device according to claim 4,
    wherein the die pad is thinned by etching from its surface side.

6. The manufacturing method of the semiconductor device according to claim 5,
    wherein the step (b) is carried out by fixing the first semiconductor chip to a lead frame back surface tape attached to a back surface of the lead frame via a first adhesive layer previously provided over a back surface of the first semiconductor chip.

7. The manufacturing method of the semiconductor device according to claim 6,
    wherein a surface of the first adhesive layer on an opposite side of the first semiconductor chip is exposed from the resin sealing body.

8. The manufacturing method of the semiconductor device according to claim 7,
    wherein in the step (d), the first semiconductor chip side is ball-bonded, and the second semiconductor chip side is wedge-bonded.

9. The manufacturing method of the semiconductor device according to claim 8,
    wherein the second semiconductor chip is thinner than the first semiconductor chip.

10. The manufacturing method of the semiconductor device according to claim 9,
    wherein the first semiconductor chip is an antenna switch, and the second semiconductor chip is a control chip that controls the first semiconductor chip.

11. The manufacturing method of the semiconductor device according to claim 10,
    wherein the first semiconductor chip is a compound semiconductor chip, and the second semiconductor chip is a silicon semiconductor chip.

12. The manufacturing method of the semiconductor device according to claim 10,
    wherein the first semiconductor chip is a GaAs semiconductor chip, and the second semiconductor chip is the silicon semiconductor chip.

13. The manufacturing method of the semiconductor device according to claim 12,
    wherein the plurality of rectangular unit device regions are arranged in matrix.

14. The manufacturing method of the semiconductor device according to claim 13,
    wherein positions of the die pad support leads in each unit device region approximately match those of a plurality of die pad support leads in an adjacent unit device region that is adjacent to one long side in the unit device region.

15. The manufacturing method of the semiconductor device according to claim 14,
    wherein the resin sealing body collectively seals the two or more unit device regions.

16. The manufacturing method of the semiconductor device according to claim 15, further comprising the steps of:
    (h) after the step (g), peeling the lead frame back surface tape; and
    (i) after the step (h), separating the resin sealing body into portions corresponding to the individual unit device region.

17. The manufacturing method of the semiconductor device according to claim 16,
    wherein the step (i) is carried out by dicing using a rotating blade.

18. The manufacturing method of the semiconductor device according to claim 17,
    wherein when the lead frame back surface tape is peeled in the step (h), the first adhesive layer remains on the first semiconductor chip side.

19. The manufacturing method of the semiconductor device according to claim 18, wherein a thickness of the resin sealing body is 0.5 millimeter or less.

20. The manufacturing method of the semiconductor device according to claim 19,
wherein the individually separated resin sealing body is a QFN package.

* * * * *